US012575283B2

(12) United States Patent
Park et al.

(10) Patent No.: US 12,575,283 B2
(45) Date of Patent: Mar. 10, 2026

(54) DISPLAY DEVICE

(71) Applicant: Samsung Display Co., Ltd., Yongin-si (KR)

(72) Inventors: Hoo Keun Park, Yongin-si (KR); Seung Geun Lee, Hwaseong-si (KR); Won Sik Oh, Hwaseong-si (KR); Byung Ju Lee, Seoul (KR); Seung A Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 796 days.

(21) Appl. No.: 17/452,538

(22) Filed: Oct. 27, 2021

(65) Prior Publication Data

US 2022/0140019 A1 May 5, 2022

(30) Foreign Application Priority Data

Nov. 3, 2020 (KR) ........................ 10-2020-0145087

(51) Int. Cl.
 H10K 59/35 (2023.01)
 H10K 59/38 (2023.01)
(52) U.S. Cl.
 CPC ........... H10K 59/353 (2023.02); H10K 59/38 (2023.02)
(58) Field of Classification Search
 CPC ........ H10K 59/30; H10K 59/38; H10K 59/35; H10K 59/353; H01L 33/50–508; H01L 33/00–648; H01L 27/15–156; H01L 2933/00–0091; H01L 25/0753; H10H 20/00–882; H10H 29/00–142; H10H 29/30–962
 See application file for complete search history.

(56) References Cited

U.S. PATENT DOCUMENTS

| | | | |
|---|---|---|---|
| 10,818,820 B2 | 10/2020 | Kim | |
| 2008/0173886 A1* | 7/2008 | Cheon | C09K 11/883 |
| | | | 257/E33.068 |
| 2018/0012876 A1* | 1/2018 | Kim | H01L 33/387 |

(Continued)

FOREIGN PATENT DOCUMENTS

| | | |
|---|---|---|
| KR | 10-1436123 B1 | 11/2014 |
| KR | 2019-0120467 A | 10/2019 |

(Continued)

*Primary Examiner* — Matthew C Landau
*Assistant Examiner* — Nora T. Nix
(74) *Attorney, Agent, or Firm* — Womble Bond Dickinson (US) LLP

(57) ABSTRACT

A display device includes a first substrate including a plurality of subpixels; a first electrode and a second electrode on the first substrate in each of the plurality of subpixels and spaced apart from each other; a plurality of light emitting elements having both ends on the first electrode and the second electrode, respectively; and a color control layer on the plurality of light emitting elements. The plurality of subpixels includes a first subpixel to display a first color and a second subpixel to display a second color different from the first color, and the plurality of light emitting elements includes first light emitting elements in the first subpixel and to emit light of a third color and second light emitting elements in the second subpixel and to emit light of the second color, wherein the third color is different from the first color and the second color.

12 Claims, 16 Drawing Sheets

(56) References Cited

U.S. PATENT DOCUMENTS

| | | | | |
|---|---|---|---|---|
| 2018/0019369 A1* | 1/2018 | Cho | ........................ | H01L 33/38 |
| 2018/0190747 A1* | 7/2018 | Son | ..................... | H01L 25/0753 |
| 2018/0357948 A1* | 12/2018 | Chen | ........................ | G09G 3/32 |
| 2019/0189679 A1* | 6/2019 | Kwak | ..................... | H01L 25/18 |
| 2019/0319168 A1* | 10/2019 | Kim | ..................... | H10H 20/855 |
| 2022/0093833 A1* | 3/2022 | Takiguchi | ............ | H10H 20/831 |

FOREIGN PATENT DOCUMENTS

| | | |
|---|---|---|
| KR | 10-2020-0001649 A | 1/2020 |
| KR | 10-2020-0079817 A | 7/2020 |

* cited by examiner

DR2

DR1

PX

SPX1 SPX2 SPX3

BA

TA1 TA2 TA3

10

NDA DA

CF: CF1, CF2, CF3
WCL: WCL1, WCL2
ED: EDG1, EDB1, EDB2

ED: EDG1, EDB1, EDB2

CF: CF1, CF2, CF3
WCL: WCL1, WCL2
ED: EDG1, EDB1, EDB2

CF: CF1, CF2, CF3
WCL: WCL1, WCL2
ED: EDG1, EDB1, EDB2

CF: CF1, CF2, CF3
WCL: WCL1, WCL2
ED: EDG1, EDB1, EDB2

FIG. 14

CF: CF1, CF2, CF3
TPL: TPL1, TPL2
ED_1: EDG1, EDG2, EDB2

210  230  220  SPX1

600

EDG1_1

EDG1_2

EMA

OP

710

720

730

DR2
DR3  DR1

EDG1: EDG1_1, EDG1_2

EDG1: EDG1_1, EDG1_2

DISPLAY DEVICE

CROSS-REFERENCE TO RELATED APPLICATION

This application claims priority to and the benefit of Korean Patent Application No. 10-2020-0145087, filed on Nov. 3, 2020, in the Korean Intellectual Property Office, the entire content of which is incorporated herein by reference.

BACKGROUND

1. Field

One or more embodiments of the present disclosure relate to a display device.

2. Description of the Related Art

Display devices are becoming increasingly important with the development of multimedia. Accordingly, various types (or kinds) of display devices such as organic light emitting displays and/or liquid crystal displays are being used.

A display device is a device for displaying an image and includes a display panel such as an organic light emitting display panel and/or a liquid crystal display panel. As a light emitting display panel, the display panel may include light emitting elements such as light emitting diodes (LEDs). For example, the LEDs may be organic light emitting diodes (OLEDs) using an organic material as a light emitting material or may be inorganic LEDs using an inorganic material as the light emitting material.

SUMMARY

One or more aspects of embodiments of the present disclosure provide a display device with improved luminous efficiency by positioning a first light emitting element and a second emitting element that emit light of different colors in the sub pixel and the second sub pixel, respectively, displaying (e.g., to display) different colors.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the present disclosure, there is provided a display device including: a first substrate which includes a plurality of subpixels; a first electrode and a second electrode on the first substrate in each of the a plurality of subpixels and spaced apart from each other; a plurality of light emitting elements provided in each of the plurality of subpixels and having both ends on the first electrode and the second electrode, respectively; and a color control layer on the plurality of light emitting elements in each of the plurality of subpixels, wherein the plurality of subpixels includes a first subpixel to display a first color and a second subpixel to display a second color different from the first color, wherein the plurality of light emitting elements includes first light emitting elements in the first subpixel and to emit light of a third color and second light emitting elements in the second subpixel and to emit light of the second color, and wherein the third color is different from the first color and the second color.

In one or more embodiments, the plurality of light emitting elements extend in a direction and have a length of about 500 nm to about 10 μm in the direction.

In one or more embodiments, the first color is red, the second color is blue, and the third color is green or cyan.

In one or more embodiments, the color control layer includes a first wavelength conversion pattern in the first subpixel and to convert light of the third color into light of the first color and a first light transmission pattern in the second subpixel and to transmit light of the second color.

In one or more embodiments, the plurality of subpixels further includes a third subpixel to display the third color, and the plurality of light emitting elements further includes third light emitting elements in the third subpixel and to emit light of the second color.

In one or more embodiments, the color control layer further includes a second wavelength conversion pattern in the third subpixel and to convert light of the second color into light of the third color.

In one or more embodiments, the plurality of subpixels further includes a third subpixel to display the third color, and the plurality of light emitting elements further includes third light emitting elements in the third subpixel and to emit light of the third color.

In one or more embodiments, the color control layer further includes a second light transmission pattern in the third subpixel and to transmit light of the third color.

In one or more embodiments, the display device includes a color filter layer which includes a first color filter on the first wavelength conversion pattern and a second color filter on the first light transmission pattern.

In one or more embodiments, light of the third color to be emitted from the first light emitting elements has a peak wavelength of about 480 to about 575 nm, and light of the second color to be emitted from the second light emitting elements has a peak wavelength of about 445 to about 475 nm.

According to another embodiment of the present disclosure, there is provided a display device including: a first substrate which includes a plurality of subpixels; a plurality of first electrodes and a plurality of second electrodes on the first substrate and spaced apart from each other; a plurality of light emitting elements extending in a direction and having both ends respectively on a first electrode of the plurality of first electrodes and a second electrode of the plurality of second electrodes in each of the plurality of subpixels; and a color control layer on the plurality of light emitting elements in each of the plurality of subpixels, wherein the plurality of subpixels includes a first subpixel to display a first color and a second subpixel to display a second color different from the first color, the plurality of light emitting elements have a length of about 500 nm to about 10 μm in the direction, the plurality of light emitting elements includes first light emitting elements in the first subpixel and to emit light of a third color and second light emitting elements in the second subpixel and to emit light of the second color, and the third color is different from the first color.

In one or more embodiments, the third color is different from the second color.

In one or more embodiments, the first color is red, the second color is blue, and the third color is green or cyan.

In one or more embodiments, the plurality of subpixels further includes a third subpixel to display the third color, and the plurality of light emitting elements further includes third light emitting elements which are in the third subpixel and to emit light of the second color.

In one or more embodiments, wherein the color control layer includes a first wavelength conversion pattern in the first subpixel and to convert light of the third color into light of the first color, a first light transmission pattern in the second subpixel and to transmit light of the second color, and a second wavelength conversion pattern in the third subpixel and to convert light of the second color into light of the third color.

In one or more embodiments, light of the third color to be emitted from the first light emitting elements has a peak wavelength of about 480 to about 575 nm, and light of the second color to be emitted from the second light emitting elements has a peak wavelength of about 445 to about 475 nm.

In one or more embodiments, the third color is the same as the second color.

In one or more embodiments, the first color is red, and the second color and the third color are green or cyan.

In one or more embodiments, the plurality of subpixels further includes a third subpixel to display a fourth color, the plurality of light emitting elements further includes third light emitting elements in the third subpixel and to emit light of the fourth color, and the fourth color is blue.

In one or more embodiments, wherein the color control layer includes a first wavelength conversion pattern in the first subpixel and to convert light of the third color into light of the first color, a first light transmission pattern in the second subpixel and to transmit light of the second color, and a second light transmission pattern in the third subpixel and to transmit light of the fourth color.

In a display device according to one or more embodiments, light emitting elements emitting light of different colors are provided in subpixels displaying different colors, respectively. Therefore, the luminous efficiency of the display device can be improved.

However, the effects of the present disclosure are not restricted to those set forth herein. The above and other effects of the present disclosure will become more apparent to one of daily skill in the art to which the present disclosure pertains by referencing the claims and their equivalents.

BRIEF DESCRIPTION OF THE DRAWINGS

These and/or other aspects will become apparent and more readily appreciated from the following description of the embodiments, taken in conjunction with the accompanying drawings in which:

FIG. 3 is a cross-sectional view of the display device according to the one or more embodiments;

FIG. 10 is a cross-sectional view of a display device according to one or more embodiments;

FIG. 11 is a cross-sectional view of a display device according to one or more embodiments;

FIG. 14 is a cross-sectional view of a display device according to one or more embodiments;

DETAILED DESCRIPTION

Figure 1:
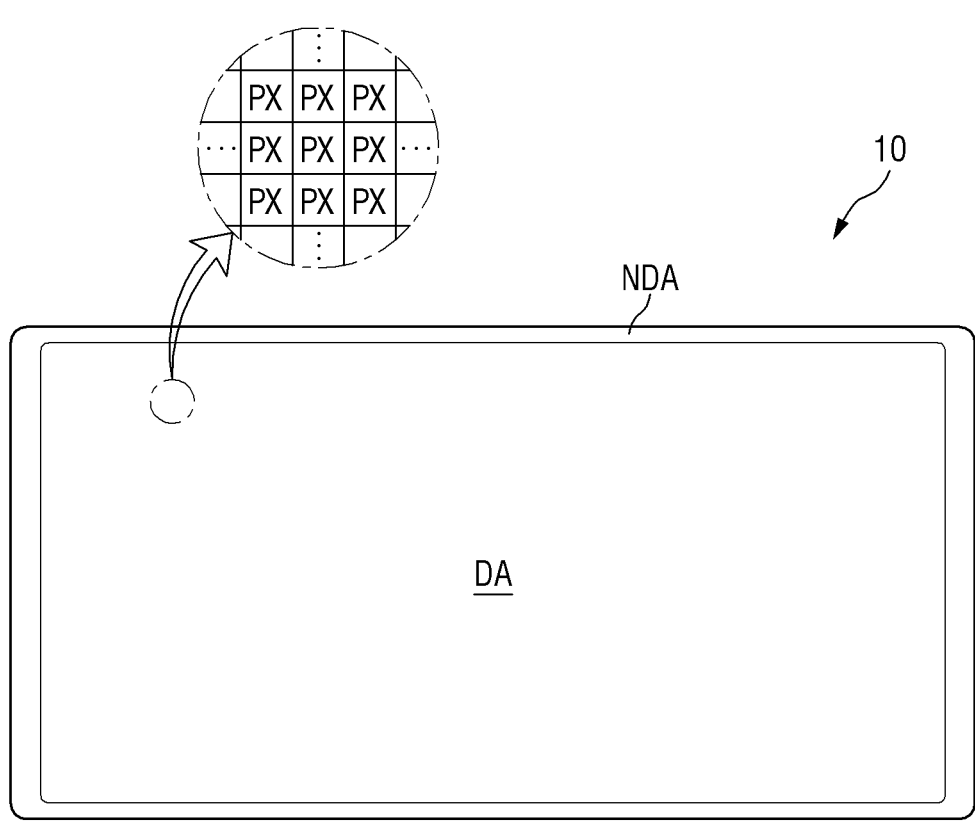
FIG. 1 is a plan view of a display device according to one or more embodiments.
Figure 1:
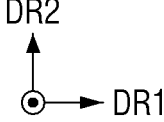

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will filly convey the scope of the disclosure to those skilled in the art.

It will also be understood that when a layer is referred to as being "on" another layer or substrate, it can be directly on the other layer or substrate (e.g., without any intervening layers therebetween), or one or more intervening layers may also be present. The same or similar reference numbers indicate the same or similar components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described with reference to the attached drawings.

FIG. 1 is a plan view of a display device 10 according to one or more embodiments.

Referring to FIG. 1, the display device 10 displays moving images and/or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel include inorganic light emitting diode (LED) display panels, organic light emitting display panels, quantum dot light emitting display panels, plasma display panels, and field emission display panels. A case where an inorganic LED display panel is applied as an example of the display panel will be described below, but the present disclosure is not limited to this case, and other suitable display panels can also be applied as long as the same technical spirit is applicable.

In the drawings of embodiments for explaining the display device 10, a first direction DR1, a second direction DR2, and a third direction DR3 are defined. The first direction DR1 and the second direction DR2 may be directions crossing each other (e.g., perpendicular to each other) in one plane (e.g., in plan view). The third direction DR3 may be a direction crossing (e.g. perpendicular to) the plane in which the first direction DR1 and the second direction DR2 are located. The third direction DR3 may cross (e.g., may be perpendicular to) each of the first direction DR1 and the second direction DR2. In the embodiments for explaining the display device 10, the third direction DR3 indicates a thickness direction of the display device 10.

The display device 10 may have a rectangular planar shape including long sides and short sides, and may be longer in the first direction DR1 than in the second direction DR2. Corners at which the long and short sides of the display device 10 meet may be right-angled in plan view. However, the present disclosure is not limited thereto, and the corners may also be rounded. The display device 10 is not limited to the above shape and may also have other planar shapes such as a square, a quadrangle with rounded corners (vertices), other polygons, and/or a circle.

A display surface of the display device 10 may be on a side of the third direction DR3 which is the thickness direction (e.g., facing upwards). In the embodiments for explaining the display device 10, unless otherwise mentioned, "above" indicates a side of (e.g., facing in) the third direction DR3 and a display direction (e.g., the direction in which the images are displayed), and an "upper surface" indicates a surface facing the side of the third direction DR3 (e.g., facing the third direction DR3). In addition, "below" indicates the other side of the third direction DR3 (e.g., a direction opposite to the third direction DR3) and a direction opposite to the display direction, and a "lower surface" indicates a surface facing the other side of the third direction DR3 (e.g., facing the direction opposite to the third direction DR3). In addition, "left," "right," "upper," and "lower" indicate directions when the display device 10 is seen (e.g., viewed) in plan view. For example, "right" indicates a side of the first direction DR1, "left" indicates the other side of the first direction DR1 (e.g., a direction opposite to the first direction DR1), "upper" indicates a side of the second direction DR2, and "lower" indicates the other side of the second direction DR2 (e.g., a direction opposite to the second direction DR2).

The display device 10 may include a display area DA and a non-display area NDA. The display area DA may be an area where a screen (e.g., an image) can be displayed, and the non-display area NDA may be an area where no screen (e.g., no image) is displayed.

The shape of the display area DA may follow the shape of the display device 10. For example, the display area DA may have a rectangular planar shape similar to the overall shape of the display device 10. The display area DA may generally occupy the center of the display device 10.

The display area DA may include a plurality of pixels PX. The pixels PX may be arranged in a matrix direction (e.g., matrix orientation). Each of the pixels PX may be rectangular or square in plan view. However, the present disclosure is not limited thereto, and the pixels PX may also have a rhombic planar shape having each side inclined with respect to a direction. The pixels PX may be alternately arranged in a stripe or pentile (PenTile®/PENTILE®) fashion or pattern (PENTILE® is a registered trademark owned by Samsung Display Co., Ltd.).

The non-display area NDA may be around the display area DA. The non-display area NDA may entirely or partially surround the display area DA. In one or more embodiments, the display area DA may be rectangular, and the non-display area NDA may be adjacent to four sides of the display area DA. The non-display area NDA may form a bezel of the display device 10. In the non-display area NDA, wirings included in the display device 10, circuit drivers, and/or a pad part on which an external device is mounted may be positioned.

Figure 2:
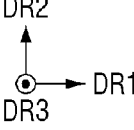
FIG. 2 is a plan view of the display device according to the one or more embodiments.

FIG. 2 is a plan view of the display device 10 according to the embodiment.

Referring to FIG. 2, the display area DA of the display device 10 includes a plurality of pixels PX arranged along a plurality of rows and columns. A pixel PX is a repeating minimum unit for display. To display full color, each pixel PX may include a plurality of subpixels SPX (SPX1, SPX2 and SPX3) emitting light of different colors. The subpixels SPX may include a first subpixel SPX1, a second subpixel SPX2, and a third subpixel SPX3 sequentially and repeatedly positioned along the first direction DR1. In one or more embodiments, each pixel PX may include the first subpixel SPX1 emitting (e.g., to emit) light of a first color, the second subpixel SPX2 emitting (e.g., to emit) light of a second color, and the third subpixel SPX3 emitting (e.g., to emit) light of a third color. For example, the first color may be red, the second color may be green, and the third color may be blue.

Each subpixel SPX may include light exiting areas TA (TA1, TA2 and TA3) defined by a pixel defining layer and a light blocking area BA around the light exiting areas TA.

Each of the light exiting areas TA may be an area where light emitted from a light emitting element layer of the display device 10, which will be described below, is provided to the outside, and the light blocking area BA may be an area through which light emitted from the light emitting element layer does not pass.

The light exiting areas TA (TA1, TA2 and TA3) may include a first light exiting area TA1, a second light exiting area TA2, and a third light exiting area TA3. The first through third light exiting areas TA1, TA2 and TA3 may be light exiting areas TA of the first through third subpixels SPX1, SPX2 and SPX3, respectively. For example, the first light exiting area TA1 may be the light exiting area TA of the first subpixel SPX1, the second light exiting area TA2 may be the light exiting area TA of the second subpixel SPX2, and the third light exiting area TA3 may be the light exiting area TA of the third subpixel SPX3.

Each of the first through third light exiting areas TA1, TA2 and TA3 may be an area where light having a set or predetermined peak wavelength exits out of the display device 10. The first light exiting area TA1 may emit light of the first color, the second light exiting area TA2 may emit light of the second color, and the third light exiting area TA3 may emit light of the third color. For example, the light of the first color may be red light having a peak wavelength of 610 to 650 nm, the light of the second color may be green light having a peak wavelength of 520 to 575 nm, and the light of the third color may be blue light having a peak wavelength of 440 to 475 nm. However, the present disclosure is not limited thereto.

The first through third light exiting areas TA1, TA2 and TA3 may be sequentially and repeatedly arranged along the first direction DR1 in the display area DA of the display device 10. Each of the first through third light exiting areas TA1, TA2 and TA3 may have, but is not limited to, a rectangular planar shape that is longer in the second direction DR2 than in the first direction DR1.

In one or more embodiments, a width of the first light exiting area TA1 in the first direction DR1, a width of the second light exiting area TA2 in the first direction DR1, and a width of the third light exiting area TA3 in the first direction DR1 may be substantially equal to each other. However, the relationship between the widths of the first through third light exiting areas TA1, TA2 and TA3 in the first direction DR1 is not limited to the embodiment illustrated in FIG. 2. For example, the width of the first light exiting area TA1 in the first direction DR1, the width of the second light exiting area TA2 in the first direction DR1, and the width of the third light exiting area TA3 in the first direction DR1 may be different from each other.

The light blocking area BA may surround the light exiting areas TA (TA1, TA2 and TA3). The light blocking area BA of a subpixel SPX contacts the light blocking area BA of a neighboring subpixel SPX (regardless of whether the neighboring subpixel SPX is in the same pixel PX). The light blocking areas BA of neighboring subpixels SPX may be connected (e.g., coupled) as one, and by extension, the light blocking areas BA of all subpixels SPX may be connected (e.g., coupled) as one, but the present disclosure is not limited thereto. The light exiting areas TA of neighboring subpixels SPX may be separated by the light blocking area BA.

Figure 3:
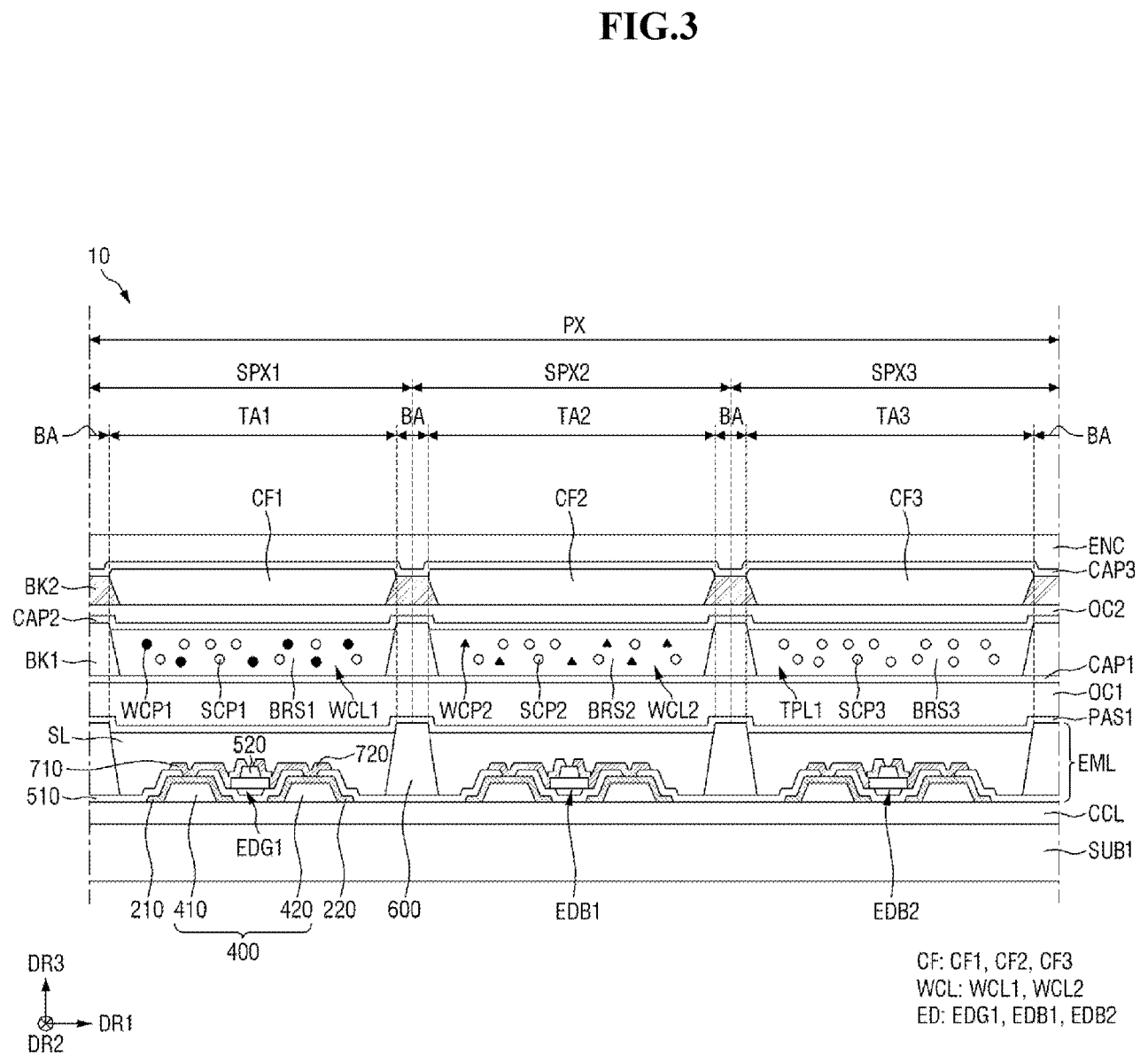

FIG. 3 is a cross-sectional view of the display device 10 according to the one or more embodiments.

Referring to FIG. 3, the display device 10 may include a first substrate SUB1, a circuit layer CCL on the first substrate SUB1, a light emitting element layer EML on the circuit layer CCL, a color control layer WCL and TPL1 on the light emitting element layer EML, and a color filter layer CF.

The first substrate SUB1 may be an insulating substrate. The first substrate SUB1 may be made of an insulating material such as glass, quartz, and/or polymer resin. The first substrate SUB1 may be a rigid substrate, but may also be a flexible substrate that can be bent, folded, rolled, etc.

The circuit layer CCL for driving pixels PX (or subpixels SPX) may be on a surface of the first substrate SUB1. The circuit layer CCL may include at least one transistor to drive the light emitting element layer EML.

The light emitting element layer EML may be on a surface of the circuit layer CCL. The light emitting element layer EML may include first banks 400, a second bank 600, first electrodes 210, second electrodes 220, first contact electrodes 710, second contact electrodes 720, light emitting elements ED, a plurality of insulating layers 510 and 520, and a filling layer SL.

The first banks 400 may be on the circuit layer CCL. The first banks 400 may be positioned in the first through third light exiting areas TA1, TA2 and TA3 of the first through third subpixels SPX1, SPX2 and SPX3, respectively. The first banks 400 in the first through third light exiting areas TA1, TA2 and TA3 may be spaced apart from each other along the first direction DR1. In one or more embodiments, the first bank 400 in the light exiting area TA of each subpixel SPX may include a first sub bank 410 and a second sub bank 420. The first sub bank 410 and the second sub bank 420 may be spaced apart from each other in the first direction DR1.

The first electrode 210 may be on the first sub bank 410 to cover the first sub bank 410. The second electrode 220 may be on the second sub bank 420 to cover the second sub bank 420. The first electrode 210 and the second electrode 220 may be electrically insulated from each other.

A first insulating layer 510 may be on the first and second electrodes 210 and 220 but may expose at least a part of each of the first and second electrodes 210 and 220. The first insulating layer 510 may protect the first electrodes 210 and the second electrodes 220 while insulating them from each other. In addition, the first insulating layer 510 may prevent or reduce the damage to the light emitting elements ED positioned on the first insulating layer 510 from directly contacting other members.

The second bank 600 may be on the first insulating layer 510 and may include openings that expose the first banks 400 and the light emitting elements ED. The second bank 600 may be at boundaries of the subpixels SPX to separate neighboring subpixels SPX. The second bank 600 may be at the boundary between neighboring subpixels SPX. The second bank 600 may prevent or reduce the overflow of ink in which a plurality of light emitting elements ED are dispersed into neighboring subpixels SPX in an inkjet process using the ink.

Each of the light emitting elements ED may be on the first insulating layer 510 between the first sub bank 410 and the second sub bank 420. Each of the light emitting elements ED may be on the first insulating layer 510 between the first and second electrodes 210 and 220, so that both ends of the light emitting element ED lie on the first and second electrodes 210 and 220, respectively.

The light emitting elements ED may include a light emitting element EDG1 (hereinafter, referred to as a 'first light emitting element') in the first subpixel SPX1, a light emitting element EDB1 (hereinafter, referred to as a 'second light emitting element') in the second subpixel SPX2, and a light emitting element EDB2 (hereinafter, referred to as a 'third light emitting element') in the third subpixel SPX3.

In one or more embodiments, light emitted from the light emitting elements ED (EDG1, EDB1 and EDB2) in the subpixels SPX (SPX1, SPX2 and SPX3) may have different colors. Of the light emitting elements ED (EDG1, EDB1 and EDB2) in the subpixels SPX (SPX1, SPX2 and SPX3), at least the first light emitting element EDG1 in the first subpixel SPX1 which emits light of the first color to the outside of the display device 10 may emit light of the second color. Of the light emitting elements ED (EDG1, EDB1 and EDB2) in the subpixels SPX (SPX1, SPX2 and SPX3), the first light emitting element EDG1 in the first subpixel SPX1 which emits light of the first color to the outside of the display device 10 may emit light of the second color, the second light emitting element EDB1 in the second subpixel SPX2, which emits light of the second color to the outside of the display device 10, and the third light emitting element EDB2 in the third subpixel SPX3, which emits light of the third color to the outside of the display device 10, may emit light of the third color. For example, at least the first light emitting element EDG1 in the first subpixel SPX1 which emits red light to the outside of the display device 10 among the light emitting elements ED (EDG1, EDB1 and EDB2) in the subpixels SPX (SPX1, SPX2 and SPX3) may emit green light or cyan light. For example, the first light emitting element EDG1 in the first subpixel SPX1 may emit green light or cyan light, which is light of the second color, the second light emitting element EDB1 in the second subpixel SPX2 may emit blue light, which is light of the third color, and the third light emitting element EDB2 in the third subpixel SPX3 may emit blue light, which is the light of the third color.

The first light emitting element EDG1 in the first subpixel SPX1, and the second and third light emitting elements EDB1 and EDB2 respectively in the second and third subpixels SPX2 and SPX3, may include active layers having different materials to emit light of different wavelength bands or light of different colors. The second and third light emitting elements EDB1 and EDB2 respectively in the second and third subpixels SPX2 and SPX3 may include active layers having the same material to emit light of the same wavelength band or light of the same color.

The first light emitting element EDG1 in the first subpixel SPX1 may be a second type light emitting element EDG emitting (e.g., configured to emit) green light or cyan light, and the second and third light emitting elements EDB1 and EDB2 respectively in the second and third subpixels SPX2 and SPX3 may be first type light emitting elements EDB emitting (e.g., configured to emit) blue light. For example, a first type light emitting element EDB (EDB1 or EDB2) may emit light of the third color, for example, blue light having a peak wavelength of about 445 to about 475 nm, and a second type light emitting element EDG may emit light of the second color, for example, green light or cyan light having a peak wavelength of about 480 to about 575 nm. Hereinafter, a light emitting element ED having a peak wavelength of about 445 to about 475 nm and emitting light of the third color will be referred to as a first type light emitting element EDB, and a light emitting element ED having a peak wavelength of about 480 to about 575 nm and emitting light of the second color will be referred to as a second type light emitting element EDG.

In one or more embodiments, the first light emitting element EDG1 in the first light exiting area TA1 of the first subpixel SPX1 may emit light of the second color, for example, green light or cyan light having a peak wavelength of about 480 to about 575 nm, and the second light emitting element EDB1 in the second light exiting area TA2 of the second subpixel SPX2 and the third light emitting element EDB2 in the third light exiting area TA3 of the third subpixel SPX3 may emit light of the third color, for example, blue light having a peak wavelength of about 445 to about 475 nm. Therefore, of the light emitted from the light emitting element layer EML, light emitted from at least the first subpixel SPX1 may be light of the second color, for example, green light or cyan light, and light emitted from the third subpixel SPX3 may be light of the third color, for example, blue light.

The color or wavelength of light emitted from the light emitting element ED (EDG1, EDB1 or EDB2) included in each subpixel SPX (SPX1, SPX2 or SPX3) may vary according to the color of light emitted from the subpixel SPX (SPX1, SPX2 or SPX3) to the outside of the display device 10. For example, as the sizes (or lengths in the extending direction) of the light emitting elements ED decrease, the luminous efficiency of a second type light emitting element EDG (EDG1) which emits light of the second color may be greater than the luminous efficiency of a first type light emitting element EDB (EDB1 or EDB2) which emits light of the third color. Therefore, the second type light emitting element EDG (EDG1) emitting light of the second color may be placed in a subpixel displaying the color of light having a peak wavelength longer than the peak wavelength of light having the third color, thereby improving the luminous efficiency of the light emitting element layer EML of the display device 10.

A second insulating layer 520 may be positioned on a part (e.g., portion) of each light emitting element ED (EDG1, EDB1 or EDB2) between the first sub bank 410 and the second sub bank 420. The second insulating layer 520 may partially cover an outer surface of each light emitting element ED. The second insulating layer 520 may be on each light emitting element ED (EDG1, EDB1 or EDB2) but may expose both ends of the light emitting element ED. The second insulating layer 520 may protect the light emitting elements ED while fixing the light emitting elements ED during a process of manufacturing the display device 10.

The first contact electrodes 710 may be on the first electrodes 210, and the second contact electrodes 720 may be on the second electrodes 220. The first contact electrodes 710 and the second contact electrodes 720 may be electrically insulated from each other.

The first and second contact electrodes 710 and 720 may contact the light emitting elements ED and the electrodes 210 and 220. For example, each of the first contact electrodes 710 may contact a part of the first electrode 210 exposed by the first insulating layer 510 and a first end of the light emitting element ED exposed by the second insulating layer 520. Each of the second contact electrodes 720 may contact a part of the second electrode 220 exposed by the first insulating layer 510 and a second end of the light emitting element ED exposed by the second insulating layer 520.

The first end of each light emitting element ED exposed by the second insulating layer 520 may be electrically connected (e.g., electrically coupled) to the first electrode 210 through the first contact electrode 710, and the second end of each light emitting element ED may be electrically connected (e.g., electrically coupled) to the second electrode 220 through the second contact electrode 720.

The filling layer SL may fill areas defined by the second bank 600. The filling layer SL may include the second bank 600 and may be provided in the openings that expose the first banks 400 and the light emitting elements ED. The filling layer SL may planarize steps formed by the first banks 400 and the light emitting elements ED. For example, the filling layer SL may include an organic insulating material, for example, an organic material such as polyimide (PI). The filling layer SL may also be omitted.

A first protective layer PAS1 may be on the light emitting element layer EML. The first protective layer PAS1 may protect the light emitting element layer EML. The first protective layer PAS1 may prevent or reduce damage to the light emitting elements ED by preventing or reducing penetration of impurities such as moisture and/or air from the outside.

The display device 10 may further include a first planarization layer OC1, a first capping layer CAP1, a first light blocking member BK1, the color control layer WCL and TPL1, a second capping layer CAP2, a second planarization layer OC2, a second light blocking member BK2, the color filter layer CF, a third capping layer CAP3, and an encapsulation layer ENC.

The first planarization layer OC1 may be above the light emitting element layer EML. The first planarization layer OC1 may planarize steps on the light emitting element layer EML. The first planarization layer OC1 may include an organic material. For example, the first planarization layer OC1 may include at least one of acryl resin, epoxy resin, phenolic resin, polyamide resin, or polyimide resin.

The first capping layer CAP1 may be on the first planarization layer OC1. The first capping layer CAP1 may seal a lower surface of the color control layer WCL and TPL1. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The first light blocking member BK1 may be on the first capping layer CAP1. The first light blocking member BK1 may be in the light blocking area BA. The first light blocking member BK1 may overlap the second bank 600 in the thickness direction (e.g., the third direction DR3) of the display device 10. The first light blocking member BK1 may block or reduce the transmission of light. The first light blocking member BK1 may prevent or reduce color mixing by preventing or reducing the intrusion of light between the first through third light exiting areas TA1, TA2 and TA3, thereby improving a color gamut. The first light blocking member BK may be formed in a lattice shape surrounding the first through third light exiting areas TA1, TA2 and TA3 in a plan view.

The first light blocking member BK1 may include an organic light blocking material and a liquid repellent component. The liquid repellent component may be made of a fluorine-containing monomer or a fluorine-containing polymer, for example, may include fluorine-containing aliphatic polycarbonate. For example, the first light blocking member BK1 may be made of a black organic material including a liquid repellent component.

The color control layer WCL and TPL1 may be on the first capping layer CAP1 exposed by the first light blocking member BK1. The color control layer WCL and TPL1 may include a wavelength conversion layer WCL which converts (e.g., is to convert) the wavelength of light incident on the color control layer WCL and TPL1 and a first light transmission pattern TPL1 which passes (e.g., is to pass) the light incident on the color control layer WCL and TPL1 while maintaining the wavelength of the light.

The wavelength conversion layer WCL or the first light transmission pattern TPL1 may be provided separately for each subpixel SPX. The wavelength conversion layer WCL or the first light transmission pattern TPL1 may be provided in each light exiting area TA, and neighboring wavelength conversion layers WCL and/or the first light transmission pattern TPL1 neighboring each other may be spaced apart from each other by the first light blocking member BK1 in the light blocking areas BA.

The wavelength conversion layer WCL and the first light transmission pattern TPL1 may be on the first capping layer CPL1. In some embodiments, the wavelength conversion layer WCL and the first light transmission pattern TPL1 may be formed using an inkjet method. However, the present disclosure is not limited thereto, and each of the wavelength conversion layer WCL and the first light transmission pattern TPL1 may, for example, be formed by coating a photosensitive material and patterning the photosensitive material through exposure and development. A case where the wavelength conversion layer WCL and the first light transmission pattern TPL1 are formed using the inkjet method will be described below as an example.

The wavelength conversion layer WCL may be in a subpixel SPX that needs to convert the wavelength of light incident from the light emitting element layer EML because the color of the subpixel SPX is different from the wavelength of the incident light. The first light transmission pattern TPL1 may be in a subpixel SPX whose color is the same as the wavelength of the light incident from the light emitting element layer EML. In the illustrated embodiment, light of the second color is incident from the light emitting element layer EML of the first subpixel SPX1, and light of the third color is incident from the light emitting element layer EML of each of the second subpixel SPX2 and the third subpixel SPX3. For example, the wavelength conversion layer WCL may be in each of the first subpixel SPX1 and the second subpixel SPX2, and the first light transmission pattern TPL1 may be in the third subpixel SPX3.

In one or more embodiments, the wavelength conversion layer WCL may include a first wavelength conversion pattern WCL1 in the first subpixel SPX1 and a second wavelength conversion pattern WCL2 in the second subpixel SPX2.

The first wavelength conversion pattern WCL1 may be in the first light exiting area TA1 defined by the first light blocking member BK1 in the first subpixel SPX1. The first wavelength conversion pattern WCL1 may convert light having a wavelength of the second color incident from the light emitting element layer EML into light having a wavelength of the first color different from the second color, and may output the light having the wavelength of the first color. For example, the first wavelength conversion pattern WCL1 may convert green light or cyan light incident from the light emitting element layer EML into red light and output the red light.

The first wavelength conversion pattern WCL1 may include a first base resin BRS1 and first wavelength conversion materials WCP1 dispersed in the first base resin BRS1. The first wavelength conversion pattern WCL1 may further include first scatterers SCP1 dispersed in the first base resin BRS1. The weight percent (wt %) of the first wavelength conversion materials WCP1 included in the first wavelength conversion pattern WCL1 may be, but is not limited to, about 30 to about 40 wt %, and the weight percent (wt %) of the first scatterers SCP1 may be, but is not limited to, about 10 wt % or less.

The second wavelength conversion pattern WCL2 may be in the second light exiting area TA2 defined by the first light blocking member BK1 in the second subpixel SPX2. The second wavelength conversion pattern WCL2 may convert light having a wavelength of the third color incident from the light emitting element layer EML into light having the wavelength of the second color different from the third color and output the light having the wavelength of the second color. For example, the second wavelength conversion pattern WCL2 may convert blue light incident from the light emitting element layer EML into green light and output the green light.

The second wavelength conversion pattern WCL2 may include a second base resin BRS2 and second wavelength conversion materials WCP2 dispersed in the second base resin BRS2. The second wavelength conversion pattern WCL2 may further include second scatterers SCP2 dispersed in the second base resin BRS2. The weight percent (wt %) of the second wavelength conversion materials WCP2 included in the second wavelength conversion pattern WCL2 may be, but is not limited to, about 40 to about 50 wt %, and the weight percent (wt %) of the second scatterers SCP2 may be, but is not limited to, about 10 wt % or less.

The first light transmission pattern TPL1 may be in the third light exiting area TA3 defined by the first light blocking member BK1 in the third subpixel SPX3. The first light transmission pattern TPL1 may output light having the wavelength of the third color incident from the light emitting element layer EML while maintaining the wavelength of the light. For example, the first light transmission pattern TPL1 may transmit blue light incident from the light emitting element layer EML while maintaining the wavelength of the blue light.

The first light transmission pattern TPL1 may include a third base resin BRS3. The first light transmission pattern TPL1 may further include third scatterers SCP3 dispersed in the third base resin BRS3. The weight percent (wt %) of the third scatterers SCP3 included in the first light transmission pattern TPL1 may be, but is not limited to, about 10 wt % or less.

The first through third base resins BRS1 through BRS3 may include a light-transmitting organic material. For example, the first through third base resins BRS1 through BRS3 may include epoxy resin, acrylic resin, cardo resin, and/or imide resin. The first through third base resins BRS1 through BRS3 may include the same material, but the present disclosure is not limited thereto.

The first through third scatterers SCP1 through SCP3 may have a different refractive index from the first through third base resins BRS1 through BRS3. The first through third scatterers SCP1 through SCP3 may include metal oxide particles and/or organic particles. Examples of the metal oxide may include titanium oxide (TiOx), zirconium oxide (ZrOx), aluminum oxide (AlxOy), indium oxide (InxOy), zinc oxide (ZnO) and tin oxide (SnOx), and examples of the organic particle material may include acrylic resin and urethane resin. The first through third scatterers SCP1 through SCP3 may include the same material, but the present disclosure is not limited thereto.

The first wavelength conversion materials WCP1 may be materials that convert the second color into the first color, and the second wavelength conversion materials WCP2 may be materials that convert the third color into the second color. For example, the first wavelength conversion materials WCP1 may be materials that convert green light or cyan light into red light, and the second wavelength conversion materials WCP2 may be materials that convert blue light into green light. The first wavelength conversion materials WCP1 and the second wavelength conversion materials WCP2 may be quantum dots, quantum rods, or phosphors. The quantum dots may include group IV nanocrystals, group II-VI compound nanocrystals, group III-V compound nanocrystals, group IV-VI compound nanocrystals, or a combination of the same.

The second capping layer CAP2 may be on the color control layer WCL and TPL1 and the first light blocking member BK1 to cover them. For example, the second capping layer CAP2 may prevent or reduce damage to or contamination of the first wavelength conversion pattern WCL1, the second wavelength conversion pattern WCL2 and the first light transmission layer TPL1 by sealing the first wavelength conversion pattern WCL1, the second wavelength conversion pattern WCL2, the first light transmission pattern TPL1 and the first light blocking member BK1. The second capping layer CAP2 may be made of an inorganic material. The second capping layer CAP2 may be made of the same material as the first capping layer CAP1 or may be made of any of the materials exemplified in the description of the first capping layer CAP1.

The second planarization layer OC2 may be on the second capping layer CAP2 to planarize steps on the first and second wavelength conversion patterns WCL1 and WCL2 and the first light transmission pattern TPL1. The second planarization layer OC2 may include an organic material. For example, the second planarization layer OC2 may include at least one of acryl resin, epoxy resin, phenolic resin, polyamide resin, or polyimide resin.

The second light blocking member BK2 may be on the second planarization layer OC2. The second light blocking member BK2 on the second planarization layer OC2 may be in the light blocking area BA along the boundary of each subpixel SPX. The second light blocking member BK2 may overlap the first light blocking member BK1 and/or the second bank 600 in the thickness direction (e.g., the third direction DR3) of the display device 10. The second light blocking member BK2 may not only block or reduce light emission but also suppress or reduce the reflection of external light. The second light blocking member BK2 may be formed in a lattice shape surrounding the first through third light exiting areas TA1, TA2 and TA3 in plan view.

The second light blocking member BK2 may include an organic material. In one or more embodiments, the second light blocking member BK2 may include a light absorbing material that absorbs light of a visible wavelength band. Because the second light blocking member BK2 includes a light absorbing material and is positioned along the boundary of each subpixel SPX, it may define the light exiting area TA (TA1, TA2 or TA3) of each subpixel SPX. For example, the second light blocking member BK2 may be a subpixel defining layer which defines the light exiting area TA of each subpixel SPX.

The color filter layer CF may be on the second planarization layer OC2. The color filter layer CF may be on a surface of the second planarization layer OC2 in areas defined by the second light blocking member BK2.

The color filter layer CF may include a first color filter CF1, a second color filter CF2, and a third color filter CF3. The first color filter CF1 may be in the first light exiting area TA1 of the first subpixel SPX1, the second color filter CF2 may be in the second light exiting area TA2 of the second subpixel SPX2, and the third color filter CF3 may be in the third light exiting area TA3 of the third subpixel SPX3. The first through third color filters CF1 through CF3 may be surrounded by the second light blocking member BK2.

Each of the first through third color filters CF1 through CF3 may include a colorant such as a dye and/or a pigment that absorbs wavelengths other than a corresponding color wavelength. The first color filter CF1 may selectively transmit light of the first color (e.g., red light) and block or absorb light of the second color (e.g., green light or cyan light) and light of the third color (e.g., blue light). The second color filter CF2 may selectively transmit light of the second color (e.g., green light) and block or absorb light of the first color (e.g., red light) and light of the third color (e.g., blue light). The third color filter CF3 may selectively transmit light of the third color (e.g., blue light) and block or absorb light of the first color (e.g., red light) and light of the second color (e.g., green light). For example, the first color filter CF1 may be a red color filter, the second color filter CF2 may be a green color filter, and the third color filter CF3 may be a blue color filter.

The first through third color filters CF1 through CF3 may absorb a part of light incident from the outside of the display device 10, thereby reducing reflected light due to the external light. Therefore, the first through third color filters CF1 through CF3 can prevent or reduce color distortion due to reflection of external light.

Because the color filter layer CF is on the first and second wavelength conversion patterns WCL1 and WCL2 and the first light transmission pattern TPL1 through the second planarization layer OC2, the display device 10 may not require a separate substrate for the color filter layer CF. Therefore, the thickness of the display device 10 can be relatively reduced.

The third capping layer CAP3 may be on the color filter layer CF and the second light blocking member BK2 to cover them. The third capping layer CAP3 may protect the color filter layer CF.

The encapsulation layer ENC may be on the third capping layer CAP3. For example, the encapsulation layer ENC may include at least one inorganic layer to prevent or reduce penetration of oxygen and/or moisture. In addition, the encapsulation layer ENC may include at least one organic layer to protect the display device 10 from foreign substances such as dust.

Figure 4:
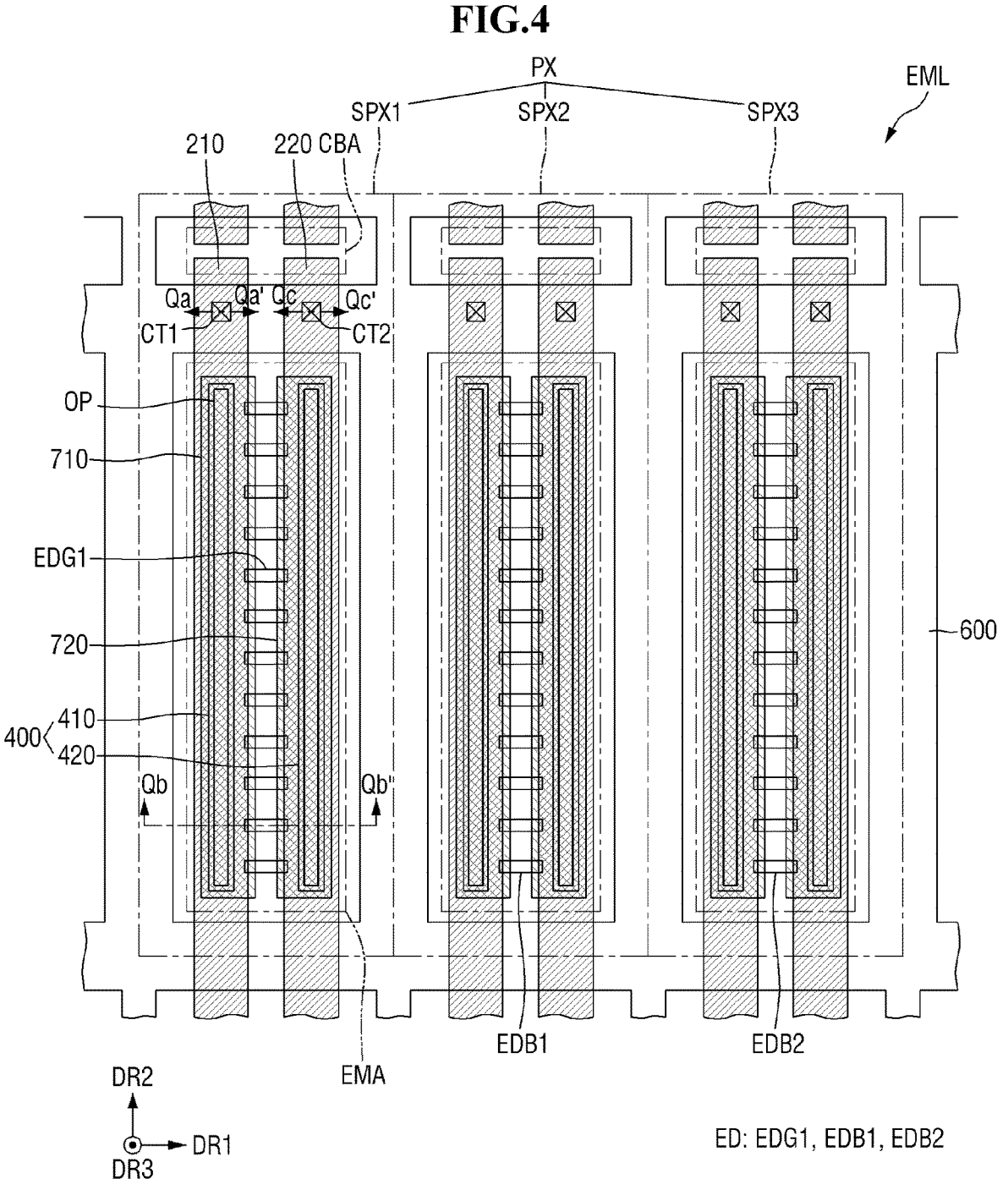
FIG. 4 is a schematic plan layout view of a pixel of a light emitting element layer according to one or more embodiments.

FIG. 4 is a schematic plan layout view of a pixel PX of the light emitting element layer EML according to one or more embodiments.

Referring to FIG. 4, one pixel PX may include a plurality of subpixels SPX (SPX1, SPX2 and SPX3) as described above.

Each subpixel SPX of the display device 10 may include an emission area EMA and a non-emission area. The emission area EMA may be an area from which light emitted from light emitting elements ED (EDG1, EDB1 and EDB2) is output, and the non-emission area may be an area from which no light is output because light emitted from the light emitting elements ED (EDG1, EDB1 and EDB2) does not reach this area.

The emission area EMA may include an area in which the light emitting elements ED (EDG1, EDB1 and EDB2) are positioned, and an area which is adjacent to the above area. In addition, the emission area EMA may further include an area from which light emitted from the light emitting elements ED (EDG1, EDB1 and EDB2) is output after being reflected or refracted by other members.

Each subpixel SPX may further include a first area CBA in the non-emission area. The first area CBA may be on a side (e.g., an upper side in FIG. 4) of the emission area EMA in the second direction DR2. The first area CBA may be between the emission areas EMA of subpixels SPX neighboring each other in the second direction DR2.

The emission areas EMA of the subpixels SPX included in one pixel PX may be arranged at intervals along the first direction DR1. Likewise, the first areas CBA of the subpixels SPX included in one pixel PX may be arranged at intervals along the first direction DR1. While the emission areas EMA and the first areas CBA are arranged at intervals along the first direction DR1, the emission areas EMA and the first areas CBA may be alternately arranged in the second direction DR2.

The first area CBA may be an area where the first electrodes 210 and the second electrodes 220 included in subpixels SPX neighboring each other along the second direction DR2 are separated from each other, respectively. Each of the subpixels SPX neighboring each other along the second direction DR2 may include the first and second electrodes 210 and 220 extending in the second direction DR2, and the first and second electrodes 210 and 220 may be separated in the first area CBA. Therefore, parts of the first and second electrodes 210 and 220 in each subpixel SPX may be in the first area CBA.

The structure of the circuit layer CCL on the first substrate SUB1 and the structure of the light emitting element layer EML on the circuit layer CCL will now be described in more detail with reference to FIGS. 4 and 5.

Figure 5:
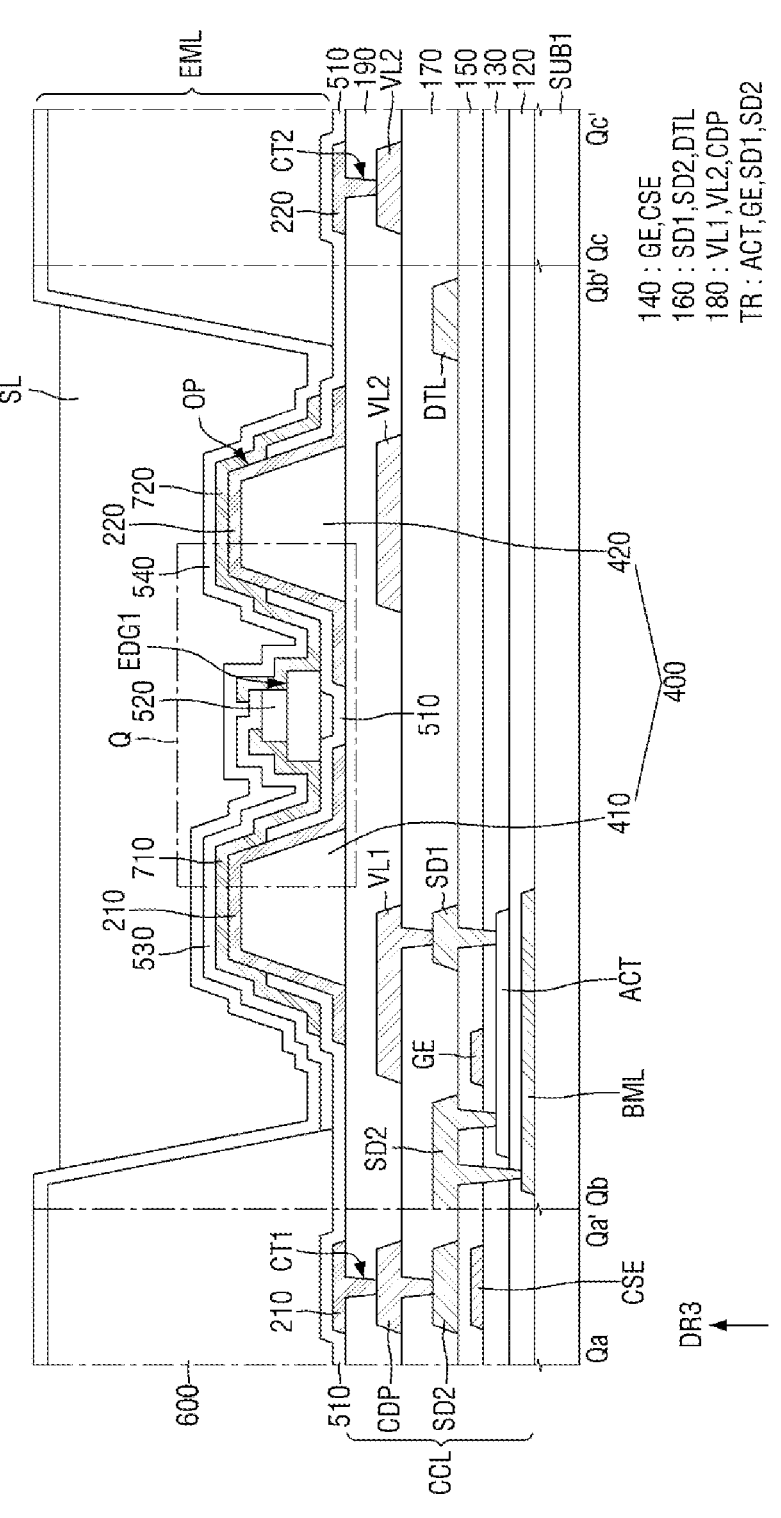
FIG. 5 is a cross-sectional view taken along lines Qa-Qa', Qb-Qb' and Qc-Qc' of FIG. 4.

FIG. 5 is a cross-sectional view taken along lines Qa-Qa', Qb-Qb' and Qc-Qc' of FIG. 4.

In FIG. 5, only the cross-sectional structure of the first subpixel SPX1 including the first light emitting elements EDG1 is illustrated. The cross-sectional structures of the second subpixel SPX2 and the third subpixel SPX3 including the second light emitting elements EDB1 and the third light emitting elements EDB2 and the cross-sectional structure of the first subpixel SPX1 are only different in the type (or kind) of the light emitting elements ED (EDG1, EDB1 or EDB2) and are similar in the arrangement of other members and the relative arrangement relationship between the light emitting elements ED (EDG1, EDB1 or EDB2) and other members. Therefore, the description of the cross-sectional structures of the second and third subpixels SPX2 and SPX3 will not be provided as it is substantially similar to the description of the cross-sectional structure of the first subpixel SPX1.

Referring to FIG. 5, the circuit layer CCL may include a bottom metal layer BML, a buffer layer 120, first through third conductive layers 140, 160 and 180, a semiconductor layer, a gate insulating layer 130, an interlayer insulating film 150, a passivation layer 170, and a via layer 190.

The bottom metal layer BML may be on the first substrate SUB1. The bottom metal layer BML may be a light blocking layer that protects an active material layer ACT of a transistor TR from external light. The bottom metal layer BML may include a material that blocks or reduces light. For example, the bottom metal layer BML may be made of an opaque metal material that blocks or reduces the transmission of light.

The bottom metal layer BML has a patterned shape. The bottom metal layer BML may be under the active material layer ACT of the transistor TR to cover at least a channel region of the active material layer ACT of the transistor TR and, in some embodiments, to cover the whole of the active material layer ACT of the transistor TR. However, the present disclosure is not limited thereto, and the bottom metal layer BML may also be omitted.

The buffer layer 120 may be on the bottom metal layer BML. The buffer layer 120 may cover the entire surface of the first substrate SUB1 on which the bottom metal layer BML is positioned. The buffer layer 120 may protect the transistor TR from moisture introduced through the first substrate SUB1 which is vulnerable to moisture penetration. The buffer layer 120 may be composed of a plurality of inorganic layers stacked alternately. For example, the buffer layer 120 may be a multilayer in which inorganic layers including at least any one of silicon oxide (SiOx), silicon nitride (SiNx), or silicon oxynitride (SiOxNy) are alternately stacked.

The semiconductor layer may be on the buffer layer 120. The semiconductor layer may include the active material layer ACT of the transistor TR. The active material layer ACT may overlap the bottom metal layer BML.

Although only one transistor TR among the transistors included in one subpixel SPX of the display device 10 is illustrated in the drawing, the present disclosure is not limited thereto. Each subpixel SPX of the display device 10 may also include a larger number of transistors. For example, the display device 10 may include two or three transistors in each subpixel SPX.

The semiconductor layer may include polycrystalline silicon, monocrystalline silicon, an oxide semiconductor, and/or the like.

In one or more embodiments, when the semiconductor layer includes polycrystalline silicon, the polycrystalline silicon may be formed by crystallizing amorphous silicon. When the semiconductor layer includes polycrystalline silicon, the active material layer ACT may include a plurality of doping regions doped with impurities and the channel region between the doping regions. In another embodiment, the semiconductor layer may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), and/or indium gallium zinc tin oxide (IGZTO).

The gate insulating layer 130 may be on the semiconductor layer. The gate insulating layer 130 may function as a gate insulating layer of the transistor TR. The gate insulating layer 130 may be an inorganic layer including an inorganic material such as silicon oxide (SiOx), silicon nitride (SiNx), and/or silicon oxynitride (SiOxNy) or may have a structure in which the above materials are stacked.

The first conductive layer 140 may be on the gate insulating layer 130. The first conductive layer 140 may include a gate electrode GE of the transistor TR and a first capacitive electrode CSE of a storage capacitor.

The gate electrode GE may overlap the channel region of the active material layer ACT in the third direction DR3. The first capacitive electrode CSE may overlap a second source/drain electrode SD2 of the transistor TR, which will be described below, in the third direction DR3. Because the first capacitive electrode CSE overlaps the second source/drain electrode SD2 in the third direction DR3, the storage capacitor may be formed between them. In some embodiments, the first capacitive electrode CSE and the gate electrode GE may be integrated into one layer. A part of the one layer may include the gate electrode GE, and the other part of the one layer may include the first capacitive electrode CSE.

The first conductive layer 140 may be, but is not limited to, a single layer or a multilayer made of any one or more selected from molybdenum (Mo), aluminum (Al), chromium (Cr), gold (Au), titanium (Ti), nickel (Ni), neodymium (Nd), copper (Cu), and alloys of the same.

The interlayer insulating film 150 is on the first conductive layer 140. The interlayer insulating film 150 may cover the first conductive layer 140. The interlayer insulating film 150 may include an inorganic insulating material such as silicon oxide (SiOx), silicon nitride (SiNx), and/or silicon oxynitride (SiOxNy).

The second conductive layer 160 is on the interlayer insulating film 150. The second conductive layer 160 may include a first source/drain electrode SD1 and the second source/drain electrode SD2 of the transistor TR and a data line DTL.

The first and second source/drain electrodes SD1 and SD2 may respectively be electrically connected (e.g., electrically coupled) to both end regions of the active material layer ACT of the transistor TR (e.g., the doping regions of the active material layer ACT of the transistor TR) through contact holes penetrating the interlayer insulating film 150 and the gate insulating layer 130. In addition, the second source/drain electrode SD2 of the transistor TR may be electrically connected (e.g., electrically coupled) to the bottom metal layer BML through another contact hole penetrating the interlayer insulating film 150, the gate insulating layer 130 and the buffer layer 120.

The data line DTL may transmit a data signal to another transistor included in the display device 10. For example, the data line DTL may be connected (e.g., coupled) to a source/drain electrode of another transistor.

The second conductive layer 160 may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The passivation layer 170 is on the second conductive layer 160. The passivation layer 170 may protect the second conductive layer 160 by covering the second conductive layer 160. The passivation layer 170 may include an inorganic insulating material such as silicon oxide (SiOx), silicon nitride (SiNx), and/or silicon oxynitride (SiOxNy).

The third conductive layer 180 is on the passivation layer 170. The third conductive layer 180 may include a first power wiring VL1, a second power wiring VL2, and a first conductive pattern CDP.

A high potential voltage (or a first power supply voltage) may be supplied to the first power wiring VL1, and a low potential voltage (or a second power supply voltage) lower than the high potential voltage (the first power supply voltage) supplied to the first power wiring VL1 may be supplied to the second power wiring VL2. The second power wiring VL2 may be electrically connected (e.g., electrically coupled) to the second electrode 220 to supply the low potential voltage (the second power supply voltage) to the second electrode 220. In addition, an alignment signal required to align the light emitting elements ED (EDG1, EDB1 or EDB2) may be transmitted to the second power wiring VL2 during the process of manufacturing the display device 10.

The first conductive pattern CDP may be electrically connected (e.g., electrically coupled) to the second source/drain electrode SD2 of the transistor TR through a contact hole penetrating the passivation layer 170. The first conductive pattern CDP may be electrically connected (e.g., electrically coupled) to the first electrode 210 through a first contact hole CT1, which will be described below, to send the first power supply voltage received from the first power wiring VL1 to the first electrode 210.

The third conductive layer 180 may be, but is not limited to, a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

The via layer 190 is on the third conductive layer 180. The via layer 190 may be on the passivation layer 170 on which the third conductive layer 180 is positioned. The via layer 190 may planarize the surface. The via layer 190 may include an organic insulating material, for example, an organic material such as polyimide (PI).

The structure of the light emitting element layer EML on the via layer 190 will now be described in more detail with reference to FIGS. 3 through 5.

The light emitting element layer EML may be on the via layer 190 of the circuit element layer CCL. The light emitting element layer EML may include a plurality of light emitting elements ED (EDG1, EDB1 or EDB2), the first bank 400, the second bank 600, the first and second electrodes 210 and 220, the first and second contact electrodes 710 and 720, a plurality of insulating layers 510, 520, 530 and 540, and the filling layer SL.

The first bank 400 may be on the via layer 190. The first bank 400 may extend in the second direction DR2 in each subpixel SPX in plan view. The first bank 400 may end within the emission area EMA defined by the second bank 600 so as not to extend to other subpixels SPX neighboring in the second direction DR2.

The first bank 400 may include the first sub bank 410 and the second sub bank 420. The first sub bank 410 and the second sub bank 420 may be spaced apart to face each other in the first direction DR1. For example, the first sub bank 410 may be on a left side in the emission are EMA in plan view, and the second sub bank 420 may be on a right side in the emission area EMA in plan view. A space formed between the first sub bank 410 and the second sub bank 420 spaced apart from each other may provide an area in which the light emitting elements ED (EDG1, EDB1 or EDB2) are placed.

At least a part of the first bank 400 may protrude upward (e.g., toward a side of the third direction DR3) from an upper surface of the via layer 190. The protruding part of the first bank 400 may have inclined side surfaces.

The first bank 400 including the inclined side surfaces may change the direction of light emitted from the light emitting elements ED (EDG1, EDB1 or EDB2) and travelling toward the side surfaces of the first bank 400 to an upward direction (e.g., the display direction). For example, the first bank 400 may provide a space in which the light emitting elements ED (EDG1, EDB1 or EDB2) are positioned, while serving as a reflective barrier that changes the direction of light emitted from the light emitting elements ED (EDG1, EDB1 or EDB2) to the display direction.

Although each side surface of the first bank 400 is inclined in a linear shape in the drawings, the present disclosure is not limited thereto. For example, each side surface (or an outer surface) of the first bank 400 may have a semicircular or semi-elliptical shape. In one or more embodiments, the first bank 400 may include, but is not limited to, an organic insulating material such as polyimide (PI).

The first electrode 210 and the second electrode 220 may be on the first bank 400 and the via layer 190 exposed by the first bank 400. For example, the first electrode 210 may be on the first sub bank 410, and the second electrode 220 may be on the second sub bank 420.

The first electrode 210 and the second electrode 220 may extend in the second direction DR2 in plan view. The first electrode 210 and the second electrode 220 may be spaced apart to face each other in the first direction DR1. The first electrode 210 and the second electrode 220 may have a substantially similar shape to the first sub bank 410 and the second sub bank 420 but may have a larger area than the first sub bank 410 and the second sub bank 420.

The first electrode 210 may extend in the second direction DR2 in plan view to overlap a part (e.g., a portion) of the second bank 600 that extends in the first direction DR1. The first electrode 210 may contact the first conductive pattern CDP through the first contact hole CT1 penetrating the via layer 190. The first electrode 210 may be electrically connected (e.g., electrically coupled) to the transistor TR through the first conductive pattern CDP.

The second electrode 220 may extend in the second direction DR2 in plan view to overlap a part (e.g., a portion) of the second bank 600 that extends in the first direction DR1. The second electrode 220 may contact the second power wiring VL2 through a second contact hole CT2 penetrating the via layer 190.

Although the first contact hole CT1 and the second contact hole CT2 overlap the second bank 600 in the drawings, the present disclosure is not limited thereto. For example, the first contact hole CT1 and the second contact hole CT2 may be in the emission area EMA surrounded by the second bank 600, instead of overlapping the second bank 600.

The first electrode 210 and the second electrode 220 may respectively be separated in the first area CBA of each subpixel SPX from the first electrode 210 and the second electrode 220 included in another subpixel SPX neighboring in the second direction DR2. This shape of the first electrode 210 and the second electrode may be formed by performing a process of cutting each electrode 210 or 220 in the first area CBA after a process of placing the light emitting elements ED (EDG1, EDB1 or EDB2) during the manufacturing process of the display device 10. However, the present disclosure is not limited thereto. In some embodiments, the first and second electrodes 210 and 220 may also extend to a subpixel SPX neighboring in the second direction DR2 and may be integrated with the first and second electrodes 210 and 220 of the neighboring subpixel SPX, or only one of the first electrode 210 and the second electrode 220 may be separated.

The shape and arrangement of the first electrode 210 and the second electrode 220 in each subpixel SPX are not particularly limited as long as at least parts of the first electrode 210 and the second electrode 220 are spaced apart to face each other to form a space in which the light emitting elements ED will be positioned.

The first electrode 210 may be on the first sub bank 410 to cover an outer surface of the first sub bank 410. The first electrode 210 may extend outward (e.g., away) from side surfaces of the first sub bank 410 to partially lie on the upper surface of the via layer 190 exposed by the first sub bank 410 and the second sub bank 420.

The second electrode 220 may be on the second sub bank 420 to cover an outer surface of the second sub bank 420. The second electrode 220 may extend outward (e.g., away) from side surfaces of the second sub bank 420 to partially lie on the upper surface of the via layer 190 exposed by the first sub bank 410 and the second sub bank 420. The first electrode 210 and the second electrode 220 may be spaced apart from each other in the first direction DR1 to expose at least a part of the via layer 190 in an area between the first electrode 210 and the second electrode 220.

Each of the first and second electrodes 210 and 220 may be electrically connected (e.g., electrically coupled) to the light emitting elements ED, and a set or predetermined voltage may be applied to the first and second electrodes 210 and 220 so that the light emitting elements ED can emit light. For example, the first and second electrodes 210 and 220 may be electrically connected (e.g., electrically coupled) to the light emitting elements ED between the first electrode 210 and the second electrode 220 through the first and second contact electrodes 710 and 720 to be described below, and may transmit electrical signals to the light emitting elements ED through the first and second contact electrodes 710 and 720.

The first and second electrodes 210 and 220 may also be utilized to form an electric field in each subpixel SPX to align the light emitting elements ED. The light emitting elements ED may be positioned between the first electrode 210 and the second electrode 220 by the electric field formed on the first electrode 210 and the second electrode 220.

The first insulating layer 510 may be on the first and second electrodes 210 and 220. The first insulating layer 510 may be on the first electrode 210 and the second electrode 220 but may include an opening OP which exposes at least a part of each of the first electrode 210 and the second electrode 220. The first and second electrodes 210 and 220 may be electrically connected (e.g., electrically coupled) to the first and second contact electrodes 710 and 720 through the openings OP included in the first insulating layer 510, respectively.

The first insulating layer 510 may protect the first electrode 210 and the second electrode 220 while insulating them from each other. In addition, the first insulating layer 510 may prevent or reduce the damage to the light emitting elements ED on the first insulating layer 510 from directly contacting other members.

The second bank 600 may be on the first insulating layer 510. The second bank 600 may include parts extending in the first direction DR1 and the second direction DR2 to form a lattice pattern in plan view. The second bank 600 may be at the boundary of each subpixel SPX to separate neighboring subpixels SPX. The second bank 600 may be formed to have a greater height than the first bank 400 to prevent or reduce the overflow of ink in which different light emitting elements ED, for example, the first through third light emitting elements EDG1, EDB1 and EDB2 are dispersed to adjacent subpixels SPX (SPX1, SPX2 and SPX3) in an inkjet printing process for aligning the light emitting elements ED during the manufacturing process of the display device 10.

The light emitting elements ED (EDG1, EDB1 or EDB2) may be on the first insulating layer 510 between the first electrode 210 and the second electrode 220, so that the first ends of the light emitting elements lie on the first electrode 210 and the second ends thereof lie on the second electrode 220.

The second insulating layer 520 may be on a part (e.g., a portion) of each light emitting element ED. The second insulating layer 520 may be on the light emitting elements ED between the first electrode 210 and the second electrode 220 but may expose both ends of each light emitting element ED. The second insulating layer 520 may partially cover an outer surface of each light emitting element ED. The second insulating layer 520 may protect the light emitting elements ED while fixing the light emitting elements ED during the manufacturing process of the display device 10.

In one or more embodiments, the material that forms the second insulating layer 520 may be between the first electrode 210 and the second electrode 220 as described above and may fill the empty space between the first insulating layer 510 and the light emitting elements ED.

The first and second contact electrodes 710 and 720 may be on the second insulating layer 520. The first contact electrode 710 and the second contact electrode 720 may extend in the second direction DR2. The first contact electrode 710 and the second contact electrode 720 may be spaced apart to face each other in the first direction DR1.

The first contact electrode 710 may be on the first electrode 210. The first contact electrode 710 may contact the first electrode 210 exposed by an opening OP included in the first insulating layer 510 and may contact the first ends of the light emitting elements ED exposed by the second insulating layer 520. For example, the first contact electrode 710 may contact the first ends of the light emitting elements ED, and the first electrode 210, to electrically connect (e.g., electrically couple) the light emitting elements ED and the first electrode 210.

A third insulating layer 530 is on the first contact electrode 710. The third insulating layer 530 may electrically insulate the first contact electrode 710 and the second contact electrode 720 from each other. The third insulating layer 530 may cover the first contact electrode 710 but may not be on the second ends of the light emitting elements ED so that the light emitting elements ED can contact the second contact electrode 720.

The second contact electrode 720 may be on the second electrode 220. The second contact electrode 720 may contact the second electrode 220 exposed by an opening OP included in the first insulating layer 510 and may contact the second ends of the light emitting elements ED exposed by the second insulating layer 520 and the third insulating layer 530. For example, the second contact electrode 720 may contact the second ends of the light emitting elements ED, and the second electrode 220, to electrically connect (e.g., electrically couple) the light emitting elements ED and the second electrode 220.

The first ends of the light emitting elements ED exposed by the second insulating layer 520 may be electrically connected (e.g., electrically coupled) to the first electrode 210 through the first contact electrode 710, and the second ends may be electrically connected (e.g., electrically coupled) to the second electrode 220 through the second contact electrode 720.

The first and second contact electrodes 710 and 720 may include a conductive material such as ITO, IZO, ITZO, and/or aluminum (Al). For example, the first and second contact electrodes 710 and 720 may include, but are not limited to, a transparent conductive material.

A fourth insulating layer 540 may be on the entire surface of the first substrate SUB1. The fourth insulating layer 540 may protect the members positioned on the first substrate SUB1 from the external environment.

Each of the first insulating layer 510, the second insulating layer 520, the third insulating layer 530 and the fourth insulating layer 540 may include an inorganic insulating material or an organic insulating material.

The filling layer SL may be on the fourth insulating layer 540. The filling layer SL may be on the fourth insulating layer 540 in an opening defined by the second bank 600. The filling layer SL may planarize steps formed by a plurality of members under the filling layer SL.

Figure 6:
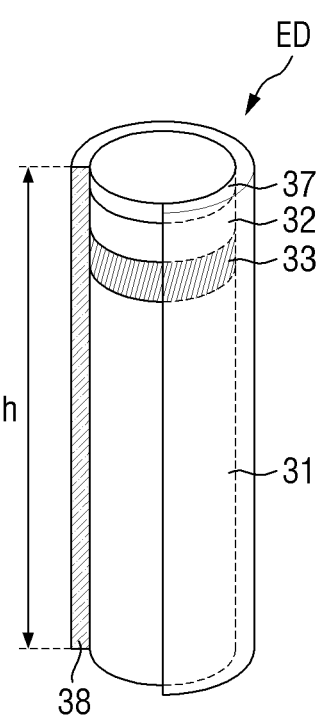
FIG. 6 is a schematic perspective view of a light emitting element according to one or more embodiments.

FIG. 6 is a schematic perspective view of a light emitting element ED according to one or more embodiments.

Referring to FIG. 6, the light emitting element ED is a particulate element and may extend in a direction (e.g., in one direction). The light emitting element ED may be shaped like a rod, tube and/or cylinder having a set or predetermined aspect ratio. A length of the light emitting element ED may be greater than a diameter of the light emitting element ED, and the aspect ratio of the light emitting element ED may be, but is not limited to, about 1.2:1 to about 100:1.

The light emitting element ED may have a nanometer-scale size (1 nm to less than 1 μm) or a micrometer-scale size (1 μm to less than 1 mm). In one or more embodiments, both the diameter and length of the light emitting element ED may have a nanometer-scale size or a micrometer-scale size. In some other embodiments, the diameter of the light emitting element ED may have a nanometer-scale size, whereas the length of the light emitting element ED may have a micrometer-scale size. In some embodiments, some of a plurality of light emitting elements ED may have a nanometer-scale size in diameter and/or length, whereas other ones of the plurality of light emitting elements ED may have a micrometer-scale size in diameter and/or length.

A length h of the light emitting element ED according to one or more embodiments in the extending direction may be in the range of about 500 nm to about 10 μm, for example, in the range of about 500 nm to about 1 μm. Luminous efficiency EQE of the light emitting element ED may vary according to the size of the light emitting element ED and/or the length h of the light emitting element ED in the extending direction. The light emitting element ED may include a different active layer 33 according to (e.g., depending on) the length h of the light emitting element ED in the extending direction. Therefore, light emitting elements ED emitting light of different colors may have different luminous efficiencies EQE. This will be described in more detail below with reference to other drawings.

The light emitting element ED may include an inorganic LED. The inorganic LED may include a plurality of semiconductor layers. For example, the inorganic LED may include a first conductivity type (e.g., n-type) semiconductor layer, a second conductivity type (e.g., p-type) semiconductor layer, and an active semiconductor layer interposed between them. The active semiconductor layer may receive holes and electrons respectively from the first conductivity type semiconductor layer and the second conductivity type semiconductor layer, and the holes and the electrons reaching the active semiconductor layer may combine together to emit light.

In one or more embodiments, the above-described semiconductor layers may be sequentially stacked along a longitudinal direction of the light emitting element ED. The light emitting element ED may include a first semiconductor layer 31, the active layer 33, and a second semiconductor layer 32 sequentially stacked in the longitudinal direction as illustrated in FIG. 6. The first semiconductor layer 31, the active layer 33, and the second semiconductor layer 32 may be the first conductivity type semiconductor layer, the active semiconductor layer, and the second conductivity type semiconductor layer described above, respectively.

The first semiconductor layer 31 may be doped with a first conductivity type dopant. The first conductivity type dopant may be Si, Ge, or Sn. In one or more embodiments, the first semiconductor layer 31 may be n-GaN doped with n-type Si.

The second semiconductor layer 32 may be spaced apart from the first semiconductor layer 31 with the active layer 33 interposed between them. The second semiconductor layer 32 may be doped with a second conductivity type dopant such as Mg, Zn, Ca, Se, or Ba. In one or more embodiments, the second semiconductor layer 32 may be p-GaN doped with p-type Mg.

The active layer 33 may include a material having a single or multiple quantum well structure. As described above, the active layer 33 may emit light through combination of electron-hole pairs according to electrical signals received through the first semiconductor layer 31 and the second semiconductor layer 32.

In some embodiments, the active layer 33 may have a structure in which a semiconductor material having a large band gap energy and a semiconductor material having a small band gap energy are alternately stacked or may include different group 3 to 5 semiconductor materials depending on the wavelength band of light that it emits.

In one or more embodiments, the first light emitting element EDG1 in the first subpixel SPX1 to emit light of the second color may include the active layer 33 including nitrogen (N) to emit green light or cyan light. In one or more embodiments, each of the second and third light emitting elements EDB1 and EDB2 in the second and third subpixels SPX2 and SPX3 to emit light of the third color may include the active layer 33 including nitrogen (N) to emit blue light.

The first light emitting element EDG1 included in the first subpixel SPX1 may emit light of the second color, for example, green light or cyan light. When the first light emitting element EDG1 emits light in a green or cyan wavelength band, the active layer 33 of the first light emitting element EDG1 may include a material such as AlGaN and/or AlGaInN. For example, the active layer 33 of the first light emitting element EDG1 may emit green light or cyan light whose central wavelength band is in the range of about 480 to about 575 nm.

The second and third light emitting elements EDB1 and EDB2 respectively included in the second and third subpixels SPX2 and SPX3 may emit light of the third color, for example, blue light. When the second and third light emitting elements EDB1 and EDB2 emit light in a blue wavelength band, the active layer 33 of each of the second and third light emitting elements EDB1 and EDB2 may include a material such as AlGaN and/or AlGaInN. For example, the active layer 33 of each of the second and third light emitting elements EDB1 and EDB2 may include AlGaInN as a quantum layer and AlInN as a well layer. For example, the active layer 33 of each of the second and third light emitting elements EDB1 and EDB2 may emit blue light whose central wavelength band is in the range of about 445 to about 475 nm.

Light emitted from the active layer 33 may be radiated not only to an outer surface of the light emitting element ED in the longitudinal direction but also to both side surfaces. For example, the direction of light emitted from the active layer 33 is not limited to one direction.

The light emitting element ED may further include an electrode layer 37 on the second semiconductor layer 32. The electrode layer 37 may contact the second semiconductor layer 32. The electrode layer 37 may be an ohmic contact electrode.

However, the present disclosure is not limited thereto, and the electrode layer 37 may also be a Schottky contact electrode.

When both ends of the light emitting element ED are electrically connected (e.g., electrically coupled) to the contact electrodes 710 and 720 to transmit electrical signals to the first semiconductor layer 31 and the second semiconductor layer 32, the electrode layer 37 may be between the second semiconductor layer 32 and the contact electrodes 710 and 720 to reduce the resistance between them. The electrode layer 37 may include at least any one of aluminum (Al), titanium (Ti), indium (In), gold (Au), silver (Ag), indium tin oxide (ITO), indium zinc oxide (IZO), and indium tin zinc oxide (ITZO). The electrode layer 37 may also include an n-type or p-type doped semiconductor material.

The light emitting element ED may further include an insulating film 38 covering outer circumferential surfaces of the first semiconductor layer 31, the second semiconductor layer 32, the active layer 33, and/or the electrode layer 37. The insulating film 38 may surround the outer surface of at least the active layer 33 and extend in the direction in which the light emitting element ED extends. The insulating film 38 may protect the above members. The insulating film 38 may be made of materials having insulating properties to prevent or reduce an electrical short circuit that may occur when the active layer 33 directly contacts an electrode through which an electrical signal is transmitted to the light emitting element ED. In addition, because the insulating film 38 protects the outer circumferential surfaces of the first and second semiconductor layers 31 and 32 as well as the active layer 33, a reduction in luminous efficiency can be prevented or reduced.

Figure 7:
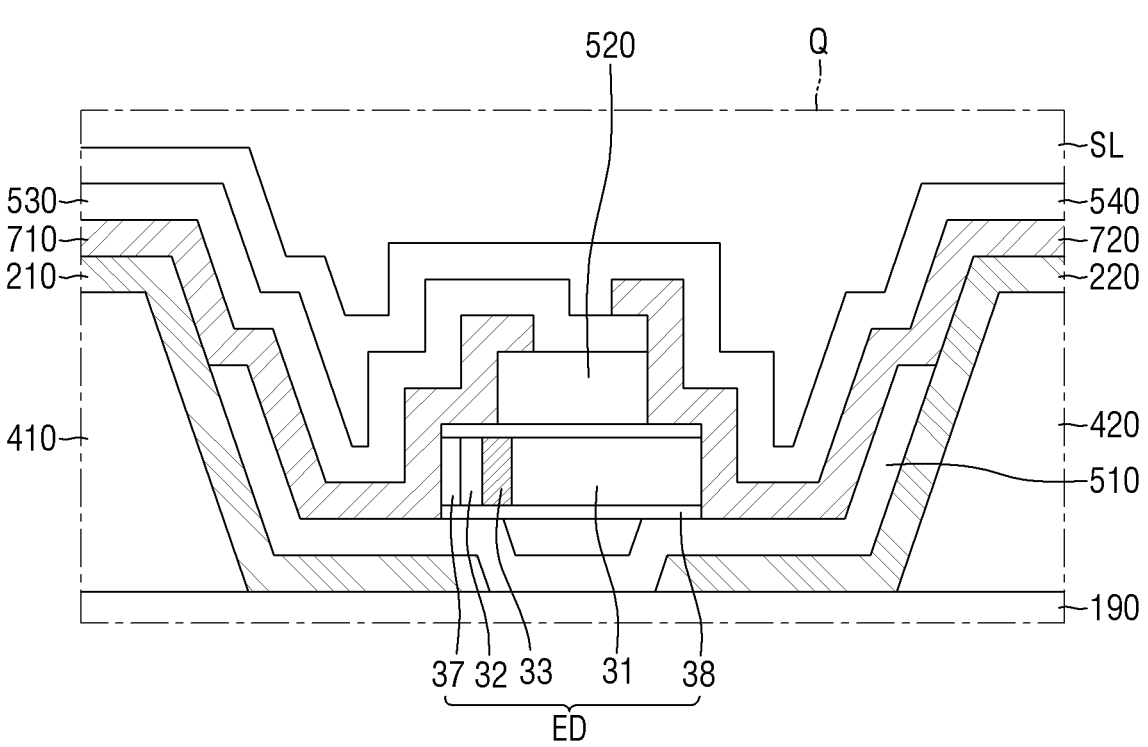
FIG. 7 is an enlarged cross-sectional view of an example of area Q of FIG. 5.

FIG. 7 is an enlarged cross-sectional view of an example of area Q of FIG. 5.

Referring to FIG. 7, the light emitting element ED may extend in a direction parallel to the first substrate SUB1, and a plurality of semiconductor layers included in the light emitting element ED may be sequentially positioned along the direction parallel to an upper surface of the first substrate SUB1. For example, in a cross section across both ends of the light emitting element ED, the first semiconductor layer 31, the active layer 33, the second semiconductor layer 32 and the electrode layer 37 may be sequentially formed (e.g., stacked) in a direction horizontal to the surface of the first substrate SUB1. The light emitting element ED may be aligned such that the first end of the light emitting element ED at which the second semiconductor layer 32 is located lies on the first electrode 210, and the second end of the light emitting element ED at which the first semiconductor layer 31 is located lies on the second electrode 220. However, the present disclosure is not limited thereto, and some light emitting elements ED may also be aligned such that the first end at which the second semiconductor layer 32 is located lies on the second electrode 220, and the second end at which the first semiconductor layer 31 is located lies on the first electrode 210.

Both ends of the light emitting element ED exposed by the second insulating layer 520 may contact the first contact electrode 710 and the second contact electrode 720, respectively.

The first contact electrode 710 may contact the first end of the light emitting element ED. The first contact electrode 710 may contact the electrode layer 37 at the first end of the light emitting element ED. The first contact electrode 710 may be electrically connected (e.g., electrically coupled) to the second semiconductor layer 32 through the electrode layer 37 of the light emitting element ED.

The second contact electrode 720 may contact the second end of the light emitting element ED. The second contact electrode 720 may contact the first semiconductor layer 31 at the second end of the light emitting element ED.

The first end of the light emitting element ED at which the second semiconductor layer 32 is located may be electrically connected (e.g., electrically coupled) to the first electrode 210 through the first contact electrode 710, and the second end of the light emitting element ED at which the first semiconductor layer 31 is located may be electrically connected (e.g., electrically coupled) to the second electrode 220 through the second contact electrode 720. For example, because both ends of the light emitting element ED contact the first contact electrode 710 and the second contact electrode 720, respectively, the light emitting element ED may receive electrical signals from the first and second electrodes 210 and 220, and light may be emitted from the active layer 33 of the light emitting element ED according to the electrical signals.

Figure 8:
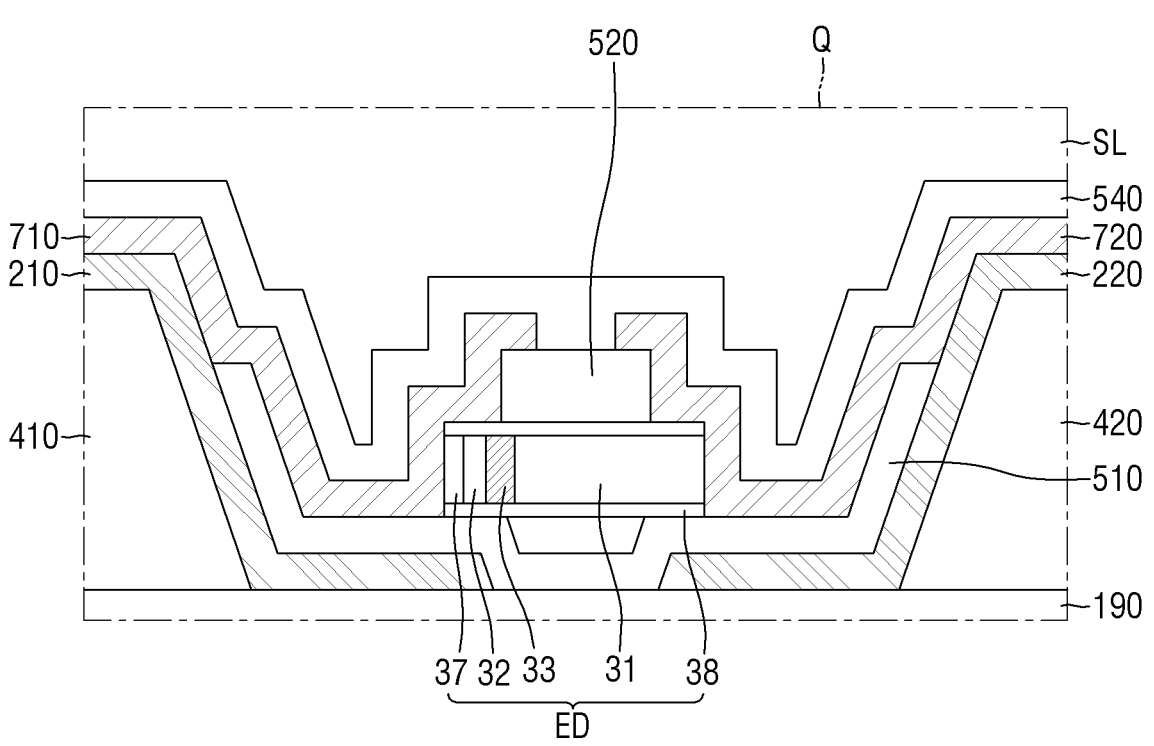
FIG. 8 is an enlarged cross-sectional view of an example of area Q of FIG. 5.

FIG. 8 is an enlarged cross-sectional view of an example of area Q of FIG. 5.

Referring to FIG. 8, the current embodiment is different from the embodiment of FIG. 7 in that the third insulating layer 530 is omitted.

In the embodiment(s), a first contact electrode 710 and a second contact electrode 720 may be directly on a second insulating layer 520. The first contact electrode 710 and the second contact electrode 720 on the second insulating layer 520 may be spaced apart from each other to expose a part of the second insulating layer 520. The second insulating layer 520 exposed by the first contact electrode 710 and the second contact electrode 720 may contact a fourth insulating layer 540 in the exposed area.

In the current embodiment, even if the third insulating layer 530 is omitted from the display device 10, the second insulating layer 520 including an organic insulating material may fix a light emitting element ED. In addition, the first contact electrode 710 and the second contact electrode 720 may be simultaneously (e.g., concurrently) formed by patterning in one mask process. Therefore, because no additional mask process is required to form the first contact electrode 710 and the second contact electrode 720, process efficiency can be improved. The current embodiment is the same as the embodiment of FIG. 7 except that the third insulating layer 530 is omitted, and thus duplicative descriptions of the same or similar elements will not be provided.

Figure 9:
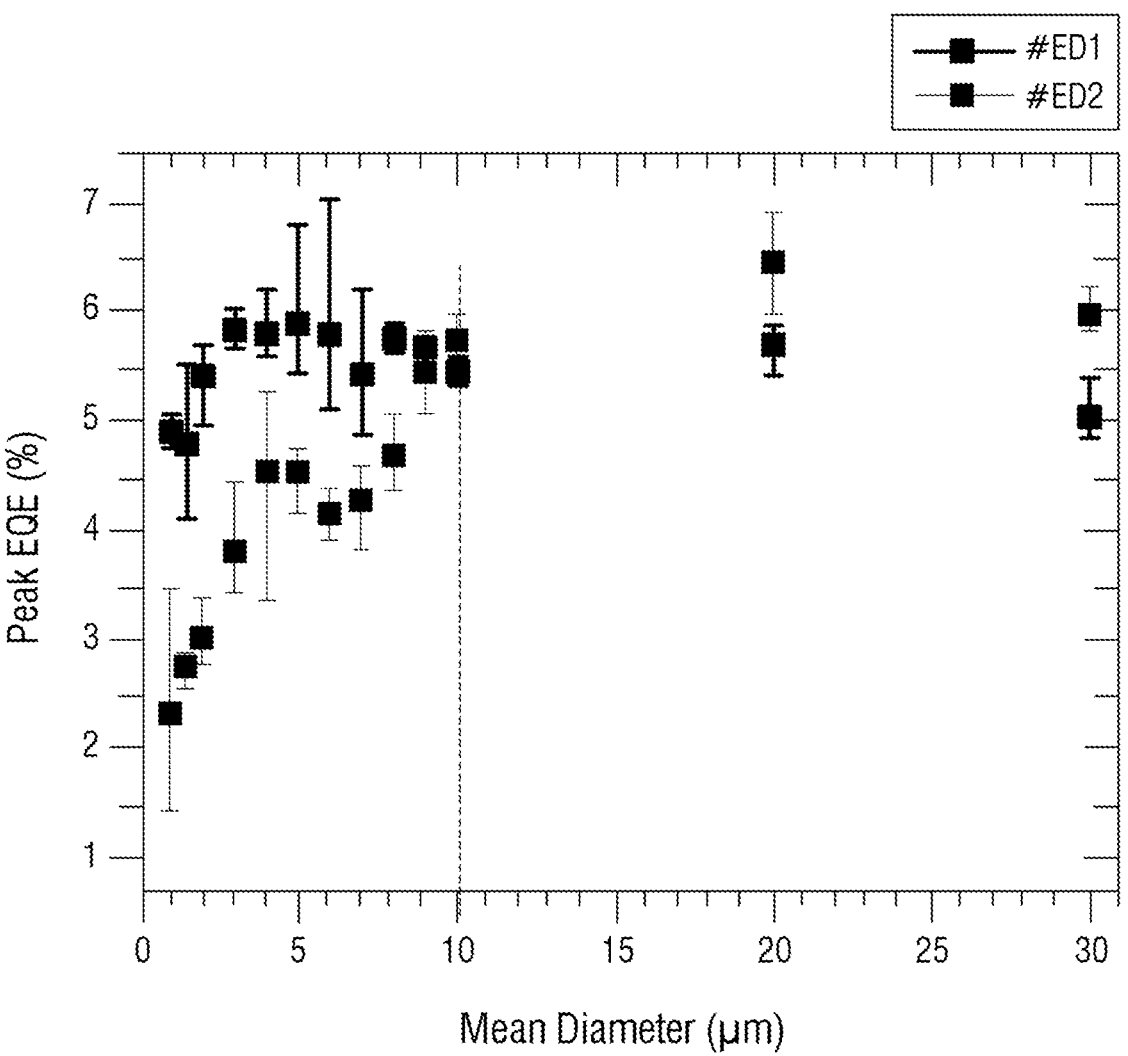
FIG. 9 is a graph illustrating luminous efficiency according to the size and type (e.g., kind) of light emitting element.

FIG. 9 is a graph illustrating luminous efficiency according to the size and type (e.g., kind) of light emitting element.

In the graph of FIG. 9, the X axis is the size of a light emitting element ED, and the Y axis is the luminous efficiency EQE of the light emitting element ED. The unit of the X axis may be μm, and the unit of the Y axis may be %. The luminous efficiency EQE (or external quantum efficiency) of the light emitting element is the ratio of conversion into electrons according to a driving current and may mean the ratio of light energy emitted out of the light emitting element.

In the graph of FIG. 9, # ED2 may represent the luminous efficiency EQE of a first type light emitting element EDB emitting light of the third color, for example, a light emitting element EDB emitting blue light according to the size of the light emitting element EDB, and # ED1 may represent the luminous efficiency EQE of a second type light emitting element EDG emitting light of the second color, for example, a light emitting element ED emitting green light or cyan light according to the size of the light emitting element ED. The first type light emitting element EDB may emit light of the third color, for example, blue light having a peak wavelength of about 445 to about 475 nm, and the second type light emitting element EDG may emit light of the second color, for example, green light or cyan light having a peak wavelength of about 480 to about 575 nm.

Referring to the graph of FIG. 9, it can be seen that both the first type light emitting element EDB and the second type light emitting element EDG have lower luminous efficiency as their size decreases. However, the luminous efficiency of the first type light emitting element EDB and the luminous efficiency of the second type light emitting element EDG according to the size of the light emitting element ED may be different in magnitude relative to a size of 10 μm.

For example, when the sizes of the light emitting elements ED are larger than 10 μm, the luminous efficiency of the first type light emitting element EDB emitting light of the third color may be greater than the luminous efficiency of the second type light emitting element EDG emitting light of the second color. On the other hand, when the sizes of the light emitting elements ED are less than or equal to 10 μm, the luminous efficiency of the first type light emitting element EDB emitting light of the third color may be smaller than the luminous efficiency of the second type light emitting element EDG emitting light of the second color. For example, as the sizes of the light emitting elements ED are reduced, the luminous efficiency of the light emitting elements ED may also be reduced. However, when the sizes of the light emitting elements ED are 10 μm or less, the luminous efficiency of the second type light emitting element EDG emitting light of the second color is greater than the luminous efficiency of the first type light emitting element EDB emitting light of the third color. In addition, when the sizes of the light emitting elements ED are 1 μm, the luminous efficiency of the first type light emitting element EDB emitting light of the third color may be in the range of 2 to 3%, and the luminous efficiency of the second type light emitting element EDG emitting light of the second color may be in the range of 4 to 5% which is about twice the luminous efficiency of the first type light emitting element EDB.

Therefore, when the peak wavelength band of a color displayed by the subpixel SPX is greater than or equal to the peak wavelength of light of the second color, the second type light emitting element EDG emitting light of the second color may be placed in the subpixel SPX to improve the efficiency of light emitted from the light emitting element layer EML. In addition, because the peak wavelength band of light emitted from the second type light emitting element EDG is greater than the peak wavelength band of light emitted from the first type light emitting element EDB, an operating voltage for light emission may be relatively small. Therefore, as in the current embodiment, the second type light emitting element EDG emitting green or cyan light may be placed in at least a subpixel displaying red, and the first type light emitting element EDB emitting blue light may be placed in a subpixel displaying blue. Accordingly, the display device 10 can have improved reliability and high luminous efficiency.

Hereinafter, other embodiments will be described. In the following embodiments, a description of the same or similar elements as those described above will not be given or will be given briefly, and differences will be mainly described.

Figure 10:
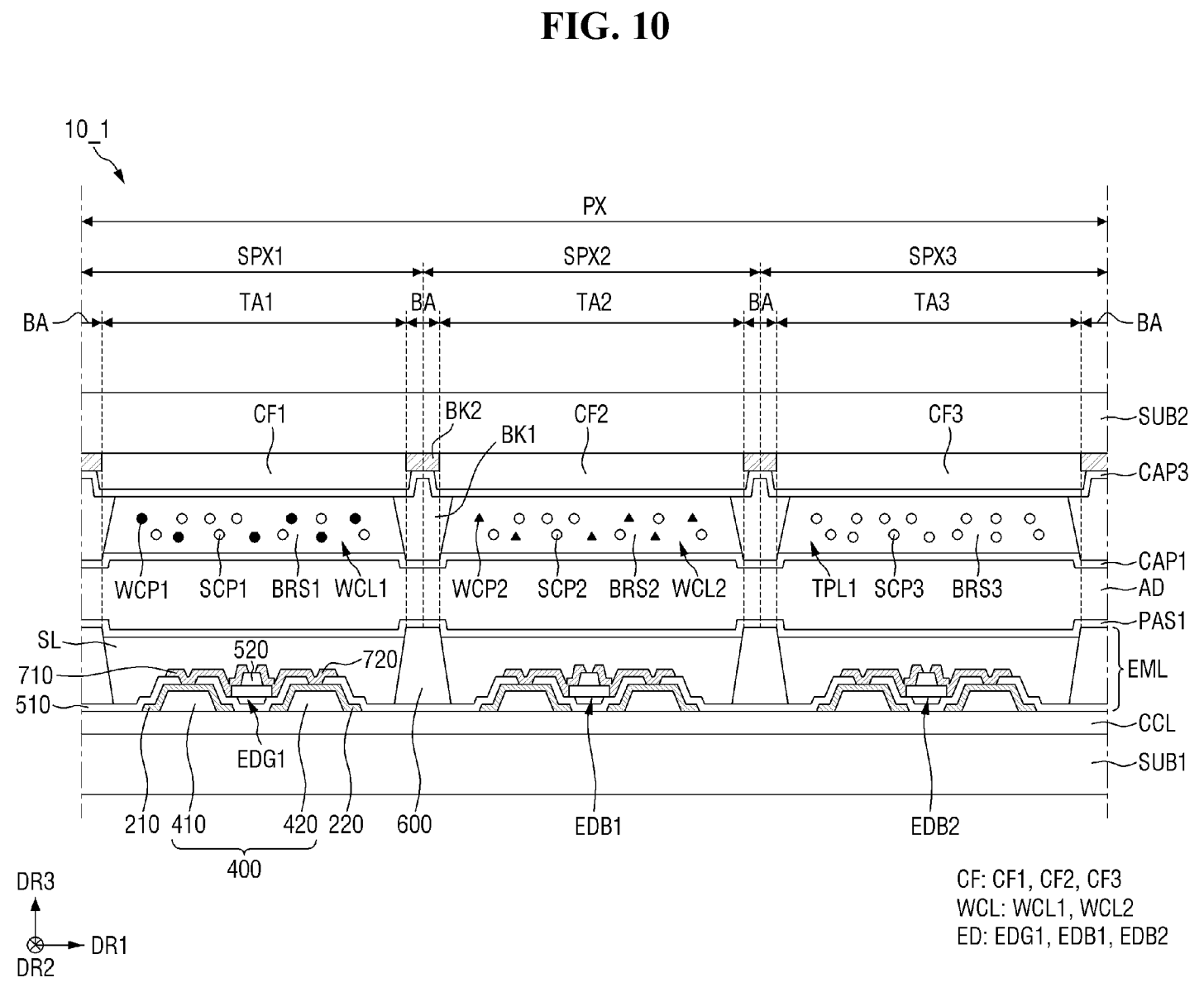

FIG. 10 is a cross-sectional view of a display device 10_1 according to one or more embodiments.

Referring to FIG. 10, the display device 10_1 according to the current embodiment is different from the display device 10 of FIG. 3 in that a color control layer WCL and TPL1 and a color filter layer CF are sequentially formed not on a light emitting element layer EML but on a separate second substrate SUB2, and a sealing member AD between a first substrate SUB1 and the second substrate SUB2 is further included.

The display device 10_1 according to the current embodiment may include a first display substrate including the first substrate SUB1, a second display substrate facing the first display substrate and including the second substrate SUB2, and a sealing member AD between the first display substrate and the second display substrate.

The first display substrate may include the first substrate SUB1, a circuit layer CCL on the first substrate SUB1, the light emitting element layer EML on the circuit layer CCL, and a first protective layer PAS1 on the light emitting element layer EML. The first substrate SUB1, the circuit layer CCL, the light emitting element layer EML and the first protective layer PAS1 included in the first display substrate are the same as the members of the display device 10 described above with reference to FIG. 3, and thus a duplicative description thereof will not be provided.

The second display substrate may be above the first protective layer PAS1 of the first display substrate to face the first protective layer PAS1. The second display substrate may include the second substrate SUB2, a second light blocking member BK2 on a surface of the second substrate SUB2 which faces the first substrate SUB1, the color filter layer CF, a first light blocking member BK1, the color control layer WCL and TPL1, and a first capping layer CAP1.

The second substrate SUB2 may include a transparent material. The second substrate SUB2 may include a transparent insulating material such as glass and/or quartz. The second substrate SUB2 may be the same as the first substrate SUB1 but may also be different from the first substrate SUB1 in material, thickness, transmittance, and/or the like. For example, the second substrate SUB2 may have a higher transmittance than the first substrate SUB1. The second substrate SUB2 may be thicker or thinner than the first substrate SUB1.

The second light blocking member BK2 may be on the surface of the second substrate SUB2 which faces the first substrate SUB1. The second light blocking member BK2 may overlap a second bank 600 of the first display substrate in the third direction DR3 and may be on the surface of the second substrate SUB2 in a light blocking area BA.

The color filter layer CF may be on the surface of the second substrate SUB2 on which the second light blocking member BK2 is positioned. The color filter layer CF may be on the surface of the second substrate SUB2 exposed by the second light blocking member BK2. Further, the color filter layer CF may be on parts (e.g., portions) of adjacent second light blocking members BK2. Although neighboring color filter layers CF are spaced apart from each other on the second light blocking member BK2 in the drawing, in some embodiments, they may at least partially overlap each other on the second light blocking member BK2.

A third capping layer CAP3 may be on the color filter layer CF. The third capping layer CAP3 may also be on the second light blocking member BK2 exposed by the color filter layer CF. The third capping layer CAP3 may directly contact a surface (e.g., a lower surface in FIG. 10) of the color filter layer CF. The third capping layer CAP3 may prevent or reduce penetration of impurities such as moisture and/or air and damage and/or contamination of the color filter layer CF.

The first light blocking member BK1 may be on the third capping layer CAP3. The first light blocking member BK1 may overlap the second light blocking member BK2 and the second bank 600 in the third direction DR3 and may be in the light blocking area BA. The first light blocking member BK1 may include openings that expose the color filter layer CF (e.g., portions of the third capping layer CAP3 covering the color filter layer CF).

The color control layer WCL and TPL1 may be provided in spaces exposed by the openings of the first light blocking member BK1. The color control layer WCL and TPL1 may be in light exiting areas TA (TA1, TA2 and TA3).

The first capping layer CAP1 may be on the color control layer WCL and TPL1. The first capping layer CAP1 may also be on the first light blocking member BK1. The first capping layer CAP1 may directly contact a surface (e.g., a lower surface in FIG. 10) of the color control layer WCL and TPL1. The first capping layer CAP1 may prevent or reduce penetration of impurities such as moisture and/or air and damage and/or contamination of the color control layer WCL and TPL1.

The sealing member AD may be between the first display substrate and the second display substrate. For example, the sealing member AD may be between the first protective layer PAS1 positioned on the light emitting element layer EML of the first display substrate and the first capping layer CAP1 positioned on the color control layer WCL and TPL1 of the second display substrate. The sealing member AD may fill a space between the first display substrate and the second display substrate while bonding them together. The sealing member AD may include, but is not limited to, a Si-based organic material and/or an epoxy-based organic material.

Figure 11:
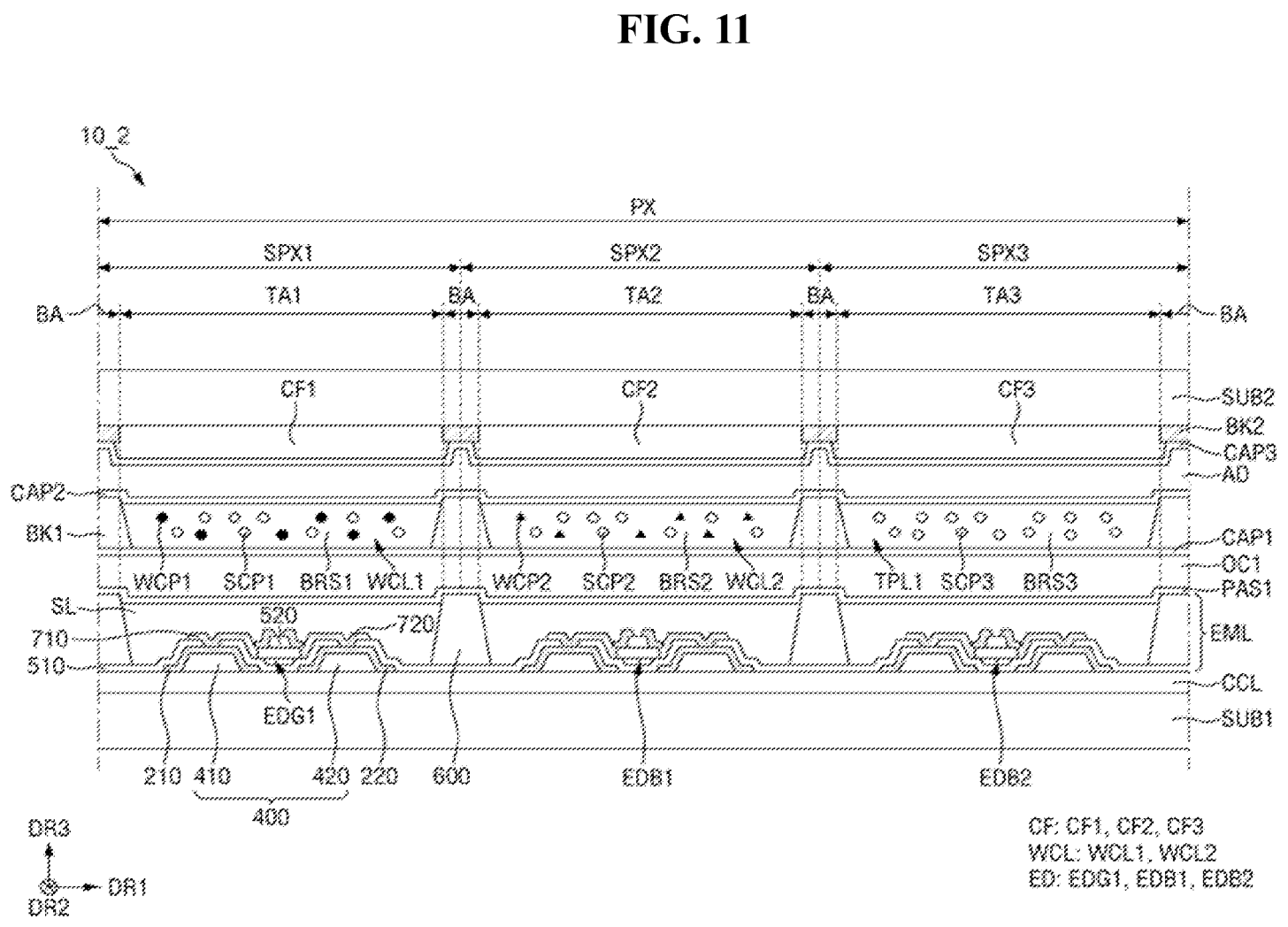

FIG. 11 is a cross-sectional view of a display device 10_2 according to one or more embodiments.

Referring to FIG. 11, the display device 10_2 according to the current embodiment is different from the display device 10 of FIG. 3 in that a color control layer WCL and TPL1 is formed on a first substrate SUB1 and on a light emitting element layer EML, and a color filter layer CF is formed not on the light emitting element layer EML but on a separate second substrate SUB2.

A first display substrate of the display device 10_2 according to the current embodiment may include the first substrate SUB1, a circuit layer CCL on the first substrate SUB1, the light emitting element layer EML on the circuit layer CCL, a first protective layer PAS1 on the light emitting element layer EML, a first planarization layer OC1 on the first protective layer PAS1, a first capping layer CAP1, a first light blocking member BK1, the color control layer WCL and TPL1, and a second capping layer CAP2. The first substrate SUB1, the circuit layer CCL, the light emitting element layer EML, the first protective layer PAS1, the first planarization layer OC1, the first capping layer CAP1, the first light blocking member BK1, the color control layer WCL and TPL1, and the second capping layer CAP2 included in the first display substrate are the same as the members of the display device 10 described above with reference to FIG. 3, and thus a duplicative description thereof will not be provided.

A second display substrate may be above the second capping layer CAP2 of the first display substrate to face the second capping layer CAP2. The second display substrate may include the second substrate SUB2, a second light blocking member BK2 on a surface of the second substrate SUB2 which faces the first substrate SUB1, the color filter layer CF, and a third capping layer CAP3.

The second substrate SUB2 may include a transparent material. The second light blocking member BK2 may be on the surface of the second substrate SUB2 which faces the first substrate SUB1. The second light blocking member BK2 may overlap a second bank 600 of the first display substrate in the third direction DR3 and may be on the surface of the second substrate SUB2 in a light blocking area BA.

The color filter layer CF may be on the surface of the second substrate SUB2 on which the second light blocking member BK2 is positioned. The color filter layer CF may be on the surface of the second substrate SUB2 exposed by the second light blocking member BK2.

The third capping layer CAP3 may be on the color filter layer CF. The third capping layer CAP3 may also be on the second light blocking member BK2 exposed by the color filter layer CF.

A sealing member AD may be provided between the first display substrate and the second display substrate. For example, the sealing member AD may be between the second capping layer CAP2 on the color control layer WCL and TPL1 of the first display substrate and the third capping layer CAP3 on the color filter layer CF of the second display substrate.

Figure 12:
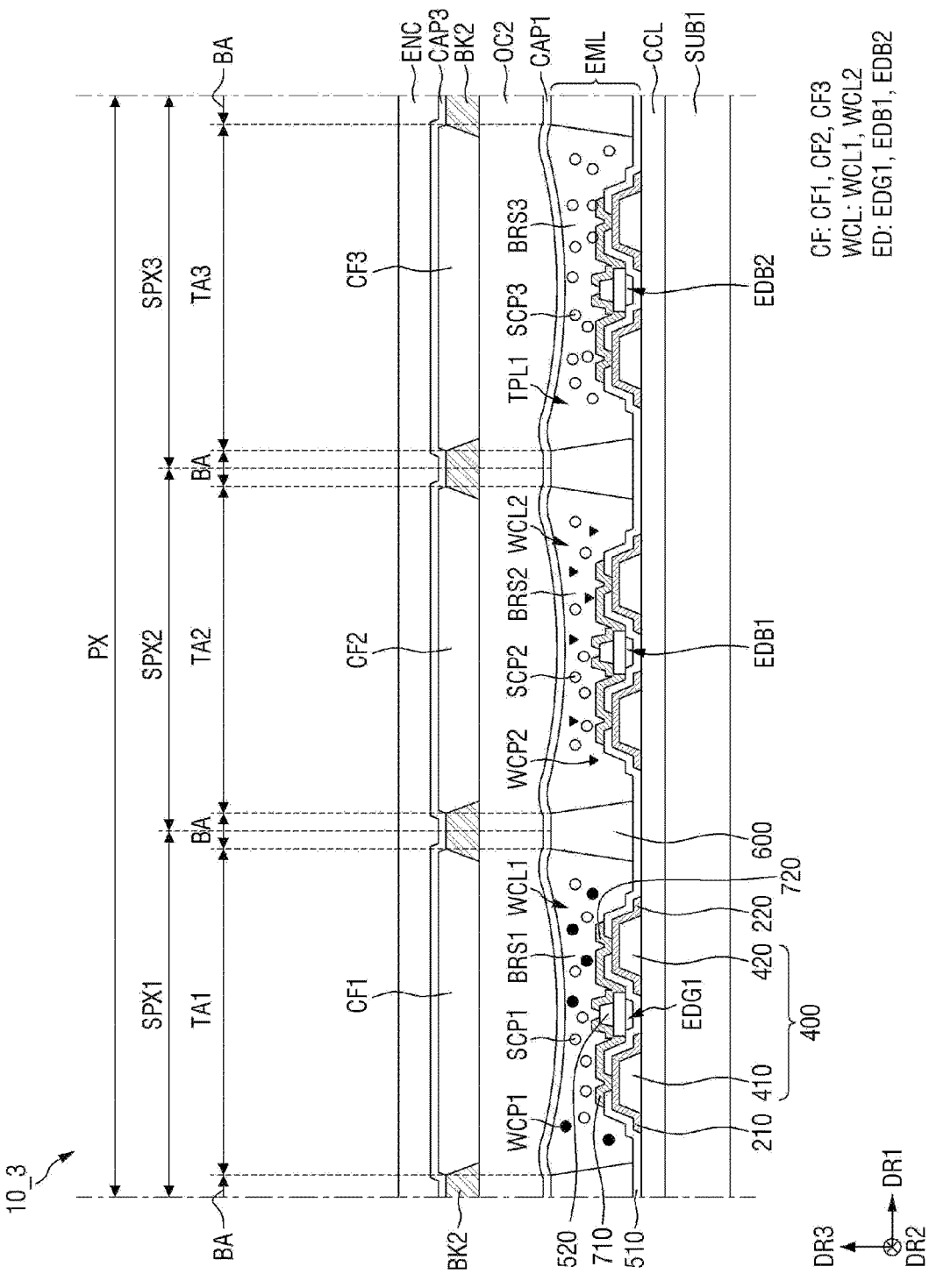
FIG. 12 is a cross-sectional view of a display device according to one or more embodiments.

FIG. 12 is a cross-sectional view of a display device 10_3 according to one or more embodiments.

Referring to FIG. 12, the display device 10_3 according to the current embodiment is different from the display device 10 of FIG. 3 in that a color control layer WCL and TPL1 is provided in spaces defined by a second bank 600 so that the color control layer WCL and TPL1 and a light emitting element layer EML are located at the same level, and a first light blocking member BK1, a first planarization layer OC1 and a second capping layer CAP2 are not provided.

The color control layer WCL and TPL1 of the display device 10_3 according to the current embodiment may be provided in openings included in (e.g., defined by) the second bank 600 of the light emitting element layer EML and exposing first banks 400 and a plurality of light emitting elements ED. The second bank 600 may be positioned at the boundary of each subpixel SPX (SPX1, SPX2 or SPX3) to separate neighboring subpixels SPX as described above, and may prevent or reduce the overflow of ink to adjacent subpixels SPX in an inkjet printing process used in a process of placing the light emitting elements ED, while defining areas in which the color control layer WCL and TPL1 is to be provided.

The color control layer WCL and TPL1 may be on the light emitting elements ED (EDG1, EDB1 and EDB2), first and second contact electrodes 710 and 720 and a plurality of insulating layers in the openings defined by the second bank 600.

A first capping layer CAP1 may be on the color control layer WCL and TPL1 and the second bank 600. The first capping layer CAP1 may cover the color control layer WCL and TPL1 and the second bank 600. The first capping layer CAP1 may prevent or reduce penetration of impurities such as moisture and/or air and contamination of the light emitting element layer EML and the color control layer WCL and TPL1.

A second planarization layer OC2 may be on the first capping layer CAP1. The second planarization layer OC2 on the first capping layer CAP1 may planarize steps formed by the color control layer WCL and TPL1 and the second bank 600.

A second light blocking member BK2 may be on the second planarization layer OC2.

A color filter layer CF may be on the second planarization layer OC2. The color filter layer CF may be on a surface of the second planarization layer OC2 in areas defined by the second light blocking member BK2.

A third capping layer CAP3 may be on the color filter layer CF and the second light blocking member BK2 to cover them. The third capping layer CAP3 may protect the color filter layer CF.

An encapsulation layer ENC may be on the third capping layer CAP3.

Figure 13:
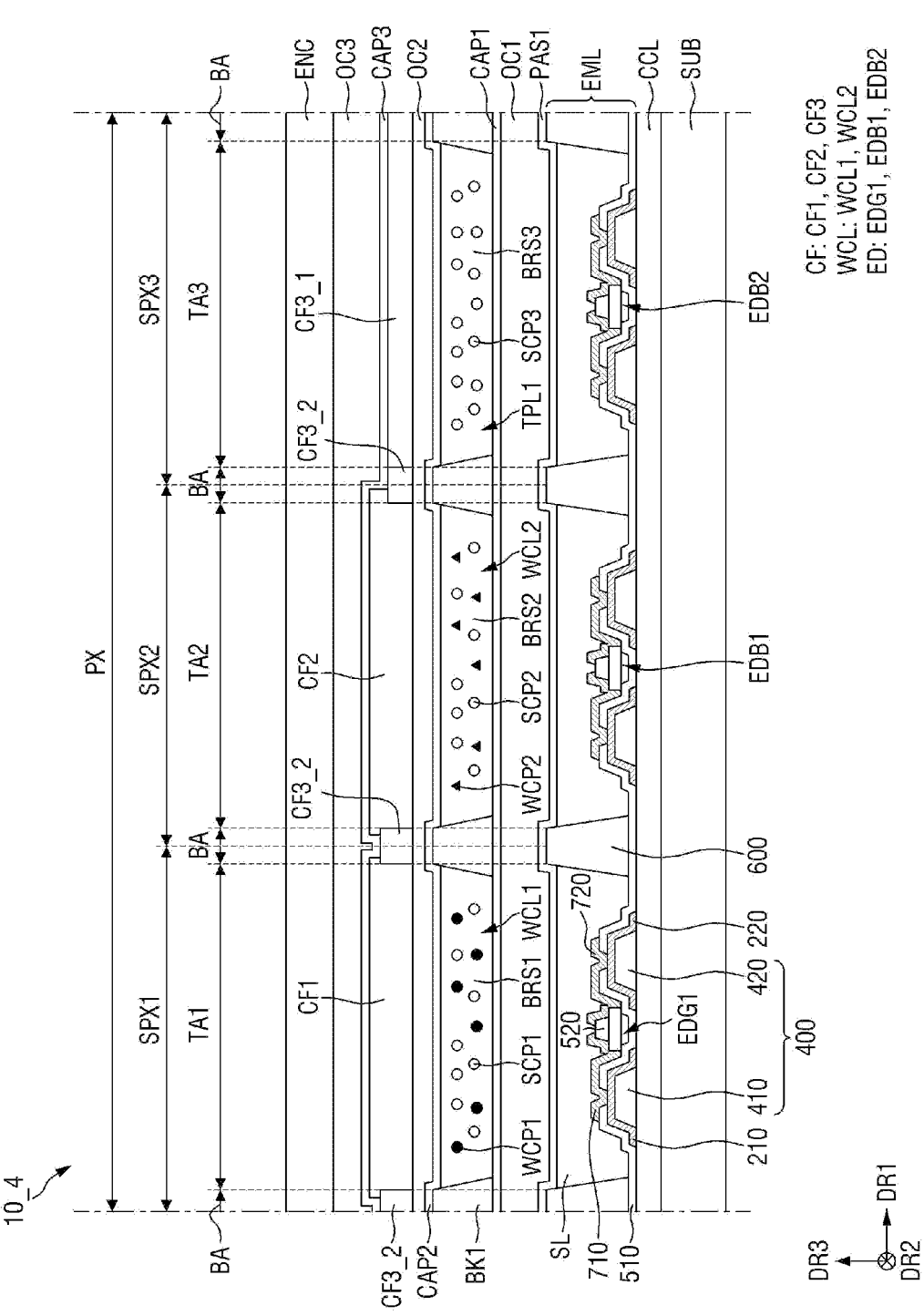
FIG. 13 is a cross-sectional view of a display device according to one or more embodiments.

FIG. 13 is a cross-sectional view of a display device 10_4 according to one or more embodiments.

Referring to FIG. 13, the display device 10_4 according to the current embodiment is different from the display device 10 of FIG. 3 in that a second light blocking member BK2 is omitted, a color pattern CF3_2 including the same colorant as a third color filter CF3_1 is further provided in a light blocking area BA, and a third planarization layer OC3 is further provided between a color filter layer CF and an encapsulation layer ENC.

The display device 10_4 according to the current embodiment may include the third color filter CF3_1 on a second capping layer CAP2 in a third light exiting area TA3 of a third subpixel SPX3 and the color pattern CF3_2 in the light blocking area BA. The color pattern CF3_2 may be in the light blocking area BA in a boundary area between adjacent subpixels SPX1, SPX2 and SPX3. The color pattern CF3_2 positioned in an area adjacent to the third light exiting area TA3 may be integrated with (e.g., may be formed integrally with) the third color filter CF3_1.

First and second color filters CF1 and CF2 included in first and second subpixels SPX1 and SPX2 may be on the second capping layer CAP2 in areas defined by the color pattern CF3_2. The first and second color filters CF1 and CF2 may also be on parts of the color pattern CF3_2. Although the first and second color filters CF1 and CF2 are spaced apart from each other on the color pattern CF3_2 in the drawing, the present disclosure is not limited thereto. For example, the first and second color filters CF1 and CF2 may overlap each other in the third direction DR3 in the light blocking area BA.

A third capping layer CAP3 may be on the color filter layer CF.

The third planarization layer OC3 may be above the color filter layer CF. The third planarization layer OC3 may be on the third capping layer CAP3. The third planarization layer OC3 may planarize steps on the color filter layer CF. The third planarization layer OC3 may include an organic material. For example, the third planarization layer OC3 may include at least one of acryl resin, epoxy resin, phenolic resin, polyamide resin, or polyimide resin.

The encapsulation layer ENC may be on the third planarization layer OC3.

Figure 14:
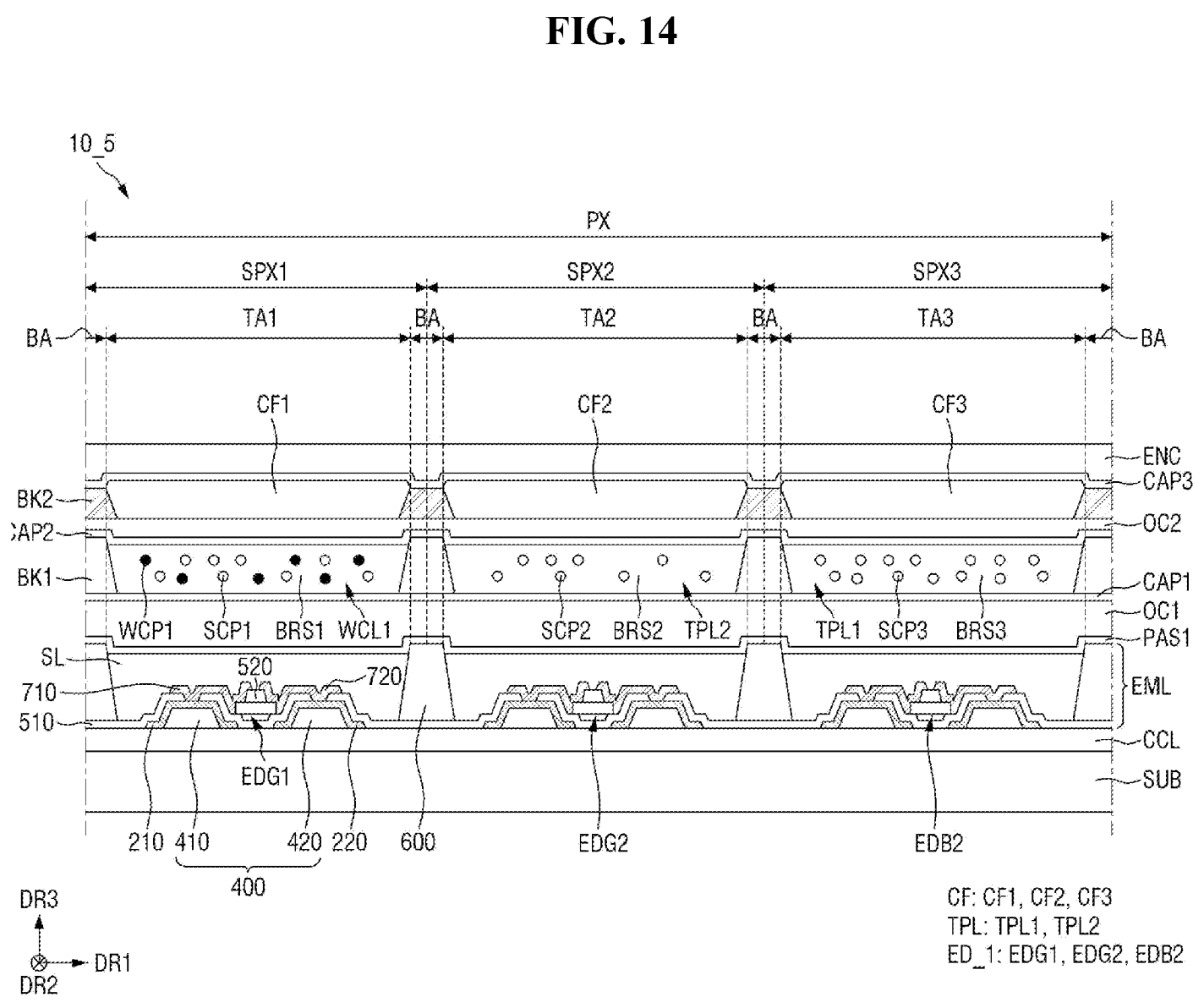

FIG. 14 is a cross-sectional view of a display device 10_5 according to one or more embodiments.

Referring to FIG. 14, the display device 10_5 according to the current embodiment is different from the display device 10 of FIG. 3 in that a second subpixel SPX2 includes a second light emitting element EDG2 which emits (e.g., is to emit) light of a second color, not light of a third color, and a second light transmission pattern TPL2 which passes (e.g., is to pass) light incident on a color control layer WCL1 and TPL while maintaining the wavelength of the incident light.

Light emitting elements ED_1 (EDG1, EDG2 and EDB2) in subpixels SPX (SPX1, SPX2 and SPX3) of the display device 10_5 according to the current embodiment may include first through third light emitting elements ED_1 (EDG1, EDG2 and EDB2) which emit light of different colors. Of the light emitting elements ED_1 (EDG1, EDG2 and EDB2) included in the subpixels SPX (SPX1, SPX2 and SPX3), the first light emitting element EDG1 in a first subpixel SPX1 which emits (e.g., is to emit) light of a first color to the outside of the display device 10_5 and the second light emitting element EDG2 in the second subpixel SPX2 which emits (e.g., is to emit) light of the second color to the outside of the display device 10_5 may both emit light of the second color, and the third light emitting element EDB2 in a third subpixel SPX3 which emits (e.g., is to emit) light of the third color to the outside of the display device 10_5 may emit light of the third color. For example, of the light emitting elements ED_1 (EDG1, EDG2 and EDB2) in the subpixels SPX (SPX1, SPX2 and SPX3), the first and second light emitting elements EDG1 and EDG2 in the first and second subpixels SPX1 and SPX2 which respectively emit red light and green light to the outside of the display device 10_5 may emit green light or cyan light. For example, the first light emitting element EDG1 in the first subpixel SPX1 may emit green light or cyan light which is light of the second color, the second light emitting element EDG2 in the second subpixel SPX2 may emit green light or cyan light which is light of the second color, and the third light emitting element EDB2 in the third subpixel SPX3 may emit blue light which is light of the third color.

The color control layer WCL1 and TPL in the subpixels SPX (SPX1, SPX2 and SPX3) of the display device 10_5 according to the current embodiment may include a first wavelength conversion pattern WCL1 and light transmission patterns TPL. The light transmission patterns TPL may include a first light transmission pattern TPL1 and the second light transmission pattern TPL2.

The first wavelength conversion pattern WCL1 may be in a first light exiting area TA1 in the first subpixel SPX1. The second light transmission pattern TPL2 may be in a second light exiting area TA2 in the second subpixel SPX2. The first light transmission pattern TPL1 may be in a third light exiting area TA3 in the third subpixel SPX3.

Because the second light emitting element EDG2 emitting light of the second color is in the second subpixel SPX2, there may be no need to convert the wavelength of light emitted from a light emitting element layer EML. Therefore, the second subpixel SPX2 may include the second light transmission pattern TPL2, and the second light transmission pattern TPL2 may output light having the wavelength of the second color incident from the light emitting element layer EML while maintaining the wavelength of the light. For example, the second light transmission pattern TPL2 may transmit light of the second color, for example, green light or cyan light incident from the light emitting element layer EML, while maintaining the wavelength of the incident light. However, the present disclosure is not limited thereto. When the second subpixel SPX2 includes the second light emitting element EDG2 emitting cyan light, it may also include a wavelength conversion pattern that converts the cyan light into green light and outputs the green light.

For example, each of the first and second light emitting elements EDG1 and EDG2 in the first light existing area TA1 of the first subpixel SPX1 and the second light exiting area TA2 of the second subpixel SPX2 may emit light of the second color, for example, green light or cyan light having a peak wavelength of about 480 to about 575 nm. In addition, the third light emitting element EDB2 in the third light exiting area TA3 of the third subpixel SPX3 may emit light of the third color, for example, blue light having a peak wavelength of about 445 to about 475 nm. Therefore, of the light emitted from the light emitting element layer EML, light emitted from the first and second subpixels SPX1 and SPX2 may be light of the second color, e.g., green light or cyan light, and light emitted from the third subpixel SPX3 may be light of the third color, e.g., blue light.

As described above, as the sizes (or lengths in an extending direction) of light emitting elements ED decrease, the luminous efficiency of a light emitting element EDG (EDG1 or EDG2) which emits light of the second color may be higher than the luminous efficiency of a light emitting element EDB2 which emits light of the third color. For example, as the sizes (or lengths in the extending direction) of the light emitting elements ED decrease, the luminous efficiency of a second type light emitting element EDG which emits green light or cyan light may be higher than the luminous efficiency of a first type light emitting element EDB which emits blue light. Therefore, in the display device 10_5 according to the current embodiment, the second type light emitting element EDG emitting light of the second color may be placed in subpixels (e.g., the first and second subpixels SPX1 and SPX2) displaying the color of light having a peak wavelength longer than the peak wavelength of light having the third color, thereby improving the luminous efficiency of the light emitting element layer EML of the display device 10_5.

Figure 15:
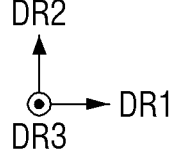
FIG. 15 is a plan layout view of a light emitting element layer according to one or more embodiments.

FIG. 15 is a plan layout view of a light emitting element layer according to one or more embodiments.

Referring to FIG. 15, the light emitting element layer according to the embodiment may include a larger number of light emitting elements per unit area because each subpixel SPX (SPX1, SPX2 or SPX3) includes a larger number of electrodes. In addition, the light emitting elements included in the light emitting element layer according to the current embodiment may include first and second sub light emitting elements connected in series to each other.

The following description will focus on the planar structures of electrodes 210, 220 and 230, first light emitting elements EDG1 and contact electrodes 710, 720 and 730 in a first subpixel SPX1, and a description of the planar structures of second and third subpixels SPX2 and SPX3 will be understood by referring to the description of the first subpixel SPX1. The current embodiment is different from the embodiment of FIG. 4 in the arrangement structure of the electrodes 210, 220 and 230 and the first light emitting elements EDG1 in the first subpixel SPX1. Thus, any duplicative description of the same or similar elements will not be provided, and differences will be mainly described below.

In the embodiment(s), an electrode layer may include a first electrode 210, a second electrode 220, and a third electrode 230. The third electrode 230 may be between the first electrode 210 and the second electrode 220.

The first light emitting elements EDG1 may include first sub light emitting elements EDG1_1 and second sub light emitting elements EDG1_2. The first sub light emitting elements EDG1_1 may be on the first electrode 210 and the third electrode 230 so that both ends thereof lie on the first electrode 210 and the third electrode 230, respectively. The second sub light emitting elements EDG1_2 may be on the third electrode 230 and the second electrode 220 so that both ends thereof lie on the third electrode 230 and the second electrode 220, respectively.

The contact electrodes 710, 720 and 730 may include a first contact electrode 710, a second contact electrode 720, and a third contact electrode 730. The first contact electrode 710 may be on the first electrode 210, the second contact electrode 720 may be on the second electrode 220, and the third contact electrode 730 may be on the third electrode 230.

The first contact electrode 710 may contact first ends of the first sub light emitting elements EDG1_1 and the first electrode 210 exposed by an opening OP of a first insulating layer 510 (see FIG. 5). The third contact electrode 730 may contact second ends of the first sub light emitting elements EDG1_1 and first ends of the second sub light emitting elements EDG1_2. The first insulating layer 510 may be interposed between the third contact electrode 730 and the third electrode 230 to electrically insulate them from each other. The second contact electrode 720 may contact second ends of the second sub light emitting elements EDG1_2 and the second electrode 220 exposed by an opening OP of the first insulating layer 510 (see FIG. 5).

An electrical signal for light emission of the light emitting elements EDG may be directly transmitted only to the first electrode 210 or the second electrode 220, and the first sub light emitting elements EDG1_1 and the second sub light emitting elements EDG1_2 may be connected (e.g., electrically coupled) through the third contact electrode 730. Accordingly, the first sub light emitting elements EDG1_1 and the second sub light emitting elements EDG1_2 may be connected in series to each other through the third contact electrode 730.

Because each subpixel SPX includes the first sub light emitting elements EDG1_1 and the second sub light emitting elements EDG1_2 in two columns and connected in series to each other, luminance per unit area can be improved. In the embodiment of FIG. 15, the first sub light emitting elements EDG1_1 and the second sub light emitting elements EDG1_2 are arranged in two columns. However, the present disclosure is not limited thereto. For example, the first sub light emitting elements EDG1_1 and the second sub light emitting elements EDG1_2 may be arranged in the second direction DR2 in one column but may be connected in series to each other as the structure of each electrode is changed.

Figure 16:
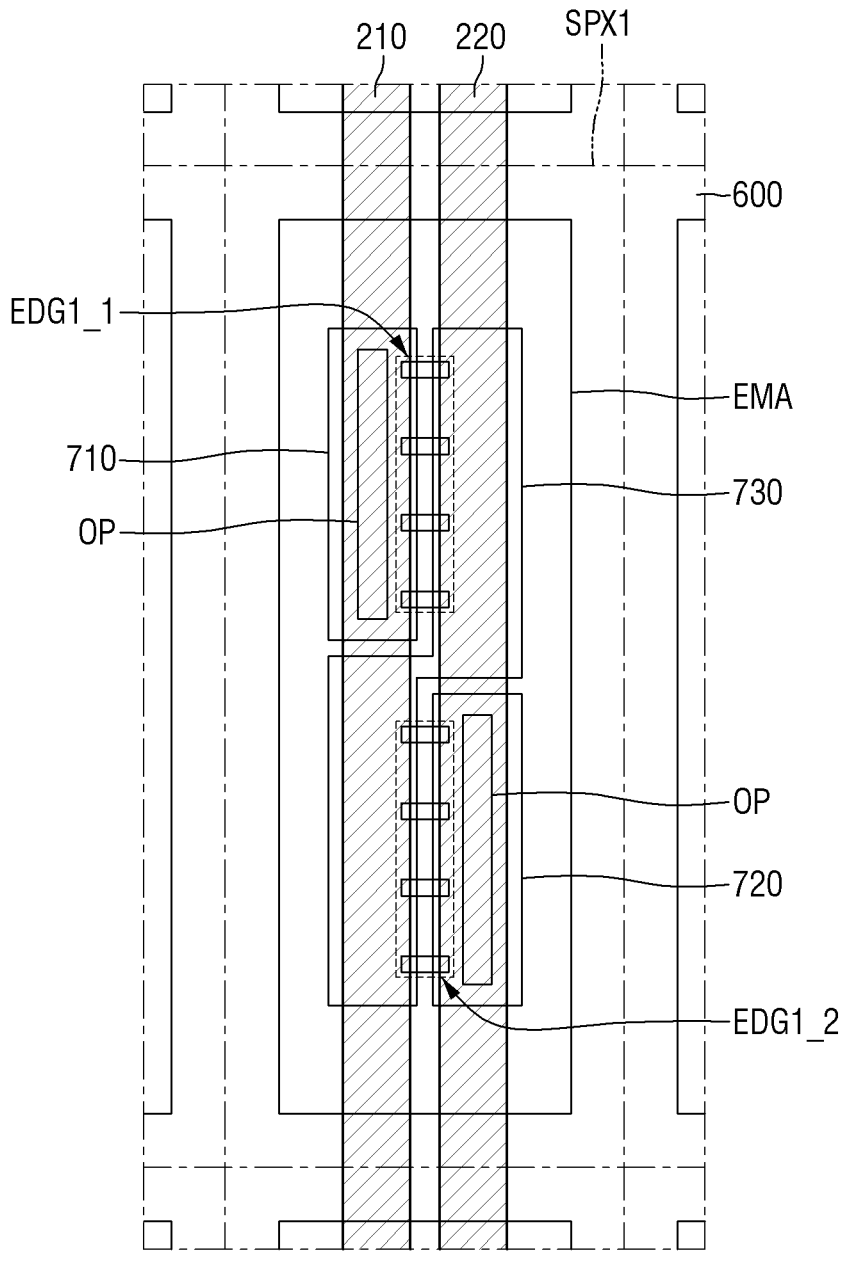
FIG. 16 is a plan layout view of a light emitting element layer according to one or more embodiments.
Figure 16:
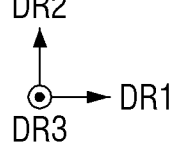

FIG. 16 is a plan layout view of a light emitting element layer according to one or more embodiments.

Referring to FIG. 16, a display device according to the current embodiment is different from the embodiment of FIG. 15 in that first and second sub light emitting elements EDG1_1 and EDG1_2 connected in series to each other are arranged in the same column, a third electrode 230 is not provided, and a third contact electrode 730 is bent in plan view.

In the embodiment(s), the first sub light emitting elements EDG1_1 and the second sub light emitting elements EDG1_2 connected in series to each other may be on a first electrode 210 and a second electrode 220 so that both ends of each of the first sub light emitting elements EDG1_1 and the second sub light emitting elements EDG1_2 lie on the first electrode 210 and the second electrode 220, respectively. The first sub light emitting elements EDG1_1 may be on an upper side in plan view, and the second sub light emitting elements EDG1_2 may be on a lower side in plan view.

Contact electrodes 710, 720 and 730 may include a first contact electrode 710, a second contact electrode 720, and the third contact electrode 730.

The first contact electrode 710 may be on the first electrode 210 and may be on the upper side in plan view. A length of the first contact electrode 710 in the second direction DR2 may be smaller than a length of the first contact electrode 710 according to the embodiment of FIG. 15 in the second direction DR2.

The second contact electrode 720 may be on the second electrode 220 and may be on the lower side in plan view. A length of the second contact electrode 720 in the second direction DR2 may be smaller than a length of the second contact electrode 720 according to the embodiment of FIG. 15 in the second direction DR2. The first contact electrode 710 and the second contact electrode 720 may not overlap each other in the first direction DR1 and/or the second direction DR2.

The third contact electrode 730 may include a first part on the second electrode 220 and above the second contact electrode 720 in plan view, a second part on the first electrode 210 and below the first contact electrode 710 in plan view, and a third part connecting the first part and the second part. For example, the third contact electrode 730 may be bent in plan view.

The first contact electrode 710 may contact first ends of the first sub light emitting elements EDG1_1 and the first electrode 210 exposed by an opening OP of a first insulating layer 510 (see FIG. 5). The third contact electrode 730 may contact second ends of the first sub light emitting elements EDG1_1 and first ends of the second sub light emitting elements EDG1_2. For example, the first part of the third contact electrode 730 may contact the second ends of the first sub light emitting elements EDG1_1, and the second part of the third contact electrode 730 may contact the first ends of the second sub light emitting elements EDG1_2. The first insulating layer 510 may be interposed between the third contact electrode 730 and the first electrode 210 to electrically insulate them from each other. The second contact electrode 720 may contact second ends of the second sub light emitting elements EDG1_2 and the second electrode 220 exposed by an opening OP of the first insulating layer 510 (see FIG. 5).

An electrical signal for light emission of the light emitting elements EDG may be directly transmitted only to the first electrode 210 or the second electrode 220, and the first sub light emitting elements EDG1_1 and the second sub light emitting elements EDG1_2 may be connected through the third contact electrode 730. Accordingly, the first sub light emitting elements EDG1_1 and the second sub light emitting elements EDG1_2 may be connected in series to each other through the third contact electrode 730.

Because each subpixel SPX includes the first sub light emitting elements EDG1_1 and the second sub light emitting elements EDG1_2 in one column and connected in series to each other, luminance per unit area can be improved. In the embodiment of FIG. 16, the first sub light emitting elements EDG1_1 and the second sub light emitting elements EDG1_2 are in one column. However, the present disclosure is not limited thereto.

Although the embodiments of the present disclosure have been disclosed for illustrative purposes, those skilled in the art will appreciate that various modifications, additions and substitutions are possible, without departing from the scope and spirit of the present disclosure as disclosed in the accompanying claims and their equivalents.

What is claimed is:

1. A display device comprising:
a first substrate comprising a plurality of subpixels;
a first electrode and a second electrode on the first substrate in each of the plurality of subpixels and spaced apart from each other;
a plurality of light emitting elements provided in each of the plurality of subpixels and having both ends on the first electrode and the second electrode, respectively; and
a color control layer on the plurality of light emitting elements in each of the plurality of subpixels,
wherein the plurality of subpixels comprises a first subpixel to display a first color, a second subpixel to display a second color different from the first color, and a third subpixel to display a third color,
wherein the plurality of light emitting elements comprises first light emitting elements in the first subpixel and to emit light of the third color, second light emitting elements in the second subpixel and to emit light of the second color, and third light emitting elements in the third subpixel and to emit light of the second color,
wherein the third color is green or cyan and is different from the first color and the second color,
wherein the second color is blue, and
wherein the light of the second light emitting elements is of the same wavelength band as the light of the third light emitting elements, and the light of the second light emitting elements and the light of the third light emitting elements have the same color.

2. The display device of claim 1, wherein the plurality of light emitting elements extend in a direction and have a length of about 500 nm to about 10 μm in the direction.

3. The display device of claim 1, wherein the first color is red.

4. The display device of claim 3, wherein the color control layer comprises a first wavelength conversion pattern in the first subpixel and to convert light of the third color into light of the first color and a first light transmission pattern in the second subpixel and to transmit light of the second color.

5. The display device of claim 4, wherein the color control layer further comprises a second wavelength conversion pattern in the third subpixel and to convert light of the second color into light of the third color.

6. The display device of claim 4, further comprising a color filter layer comprising a first color filter on the first wavelength conversion pattern and a second color filter on the first light transmission pattern.

7. The display device of claim 1, wherein light of the third color to be emitted from the first light emitting elements has a peak wavelength of about 480 to about 575 nm, and light of the second color to be emitted from the second light emitting elements has a peak wavelength of about 445 to about 475 nm.

8. A display device comprising:
a first substrate comprising a plurality of subpixels;
a plurality of first electrodes and a plurality of second electrodes on the first substrate and spaced apart from each other;

a plurality of light emitting elements extending in a direction and having both ends respectively on a first electrode of the plurality of first electrodes and a second electrode of the plurality of second electrodes in each of the plurality of subpixels; and a color control layer on the plurality of light emitting elements in each of the plurality of subpixels, wherein the plurality of subpixels comprises a first subpixel to display a first color, a second subpixel to display a second color different from the first color, and a third subpixel to display a third color, wherein the plurality of light emitting elements have a length of about 500 nm to about 10 μm in the direction, wherein the plurality of light emitting elements comprises first light emitting elements in the first subpixel and to emit light of the third color, second light emitting elements in the second subpixel and to emit light of the second color, and third light emitting elements in the third subpixel and to emit light of the second color, wherein the third color is green or cyan and is different from the first color, wherein the second color is blue, and wherein the light of the second light emitting elements is of the same wavelength band as the light of the third light emitting elements, and the light of the second light emitting elements and the light of the third light emitting elements have the same color.

9. The display device of claim 8, wherein the third color is different from the second color.

10. The display device of claim 9, wherein the first color is red.

11. The display device of claim 10, wherein the color control layer comprises a first wavelength conversion pattern in the first subpixel and to convert light of the third color into light of the first color, a first light transmission pattern in the second subpixel and to transmit light of the second color, and a second wavelength conversion pattern in the third subpixel and to convert light of the second color into light of the third color.

12. The display device of claim 9, wherein light of the third color to be emitted from the first light emitting elements has a peak wavelength of about 480 to about 575 nm, and light of the second color to be emitted from the second light emitting elements has a peak wavelength of about 445 to about 475 nm.

* * * * *